United States Patent
Song et al.

(10) Patent No.: US 11,133,235 B2
(45) Date of Patent: Sep. 28, 2021

(54) HEAT-DISSIPATING SEMICONDUCTOR PACKAGE INCLUDING A PLURALITY OF METAL PINS BETWEEN FIRST AND SECOND ENCAPSULATION MEMBERS

(71) Applicant: Delta Electronics Int'l (Singapore) Pte Ltd, Singapore (SG)

(72) Inventors: Jie Song, Singapore (SG); Xiaofeng Xu, Singapore (SG); Beng Beng Lim, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/433,917

(22) Filed: Jun. 6, 2019

(65) Prior Publication Data
US 2020/0373213 A1    Nov. 26, 2020

(30) Foreign Application Priority Data

May 23, 2019   (SG) .......................... 10201904605W

(51) Int. Cl.
| | |
|---|---|
| *H01L 23/31* | (2006.01) |
| *H01L 23/538* | (2006.01) |
| *H01L 23/482* | (2006.01) |
| *H01L 23/02* | (2006.01) |
| *H01L 23/367* | (2006.01) |
| *H01L 23/00* | (2006.01) |

(52) U.S. Cl.
CPC .......... *H01L 23/3121* (2013.01); *H01L 23/02* (2013.01); *H01L 23/367* (2013.01); *H01L 23/4822* (2013.01); *H01L 23/5389* (2013.01); *H01L 24/16* (2013.01); *H01L 2224/16227* (2013.01)

(58) Field of Classification Search
CPC ... H01L 23/3121; H01L 23/02; H01L 23/367; H01L 23/4822; H01L 23/5389; H01L 23/10; H01L 23/482; H01L 24/16; H01L 2225/06579
See application file for complete search history.

(56) References Cited

U.S. PATENT DOCUMENTS

2007/0290311 A1* 12/2007 Hauenstein ............. H01L 24/97
                                                               257/685
2019/0164865 A1*  5/2019 Elger .................... H01L 23/315

* cited by examiner

*Primary Examiner* — Matthew E. Gordon
(74) *Attorney, Agent, or Firm* — Kirton McConkie; Evan R. Witt

(57) ABSTRACT

A package structure includes a first encapsulation member, a second encapsulation member, at least one semiconductor chip, a plurality of metal pins and a second insulation layer. The first encapsulation member includes a first metal layer, a first insulation layer and a second metal layer. The at least one semiconductor chip is disposed between the first encapsulation member and the second encapsulation member. The at least one semiconductor chip comprises a plurality of conductive terminals connected with the first metal layer or a third metal layer. The plurality of metal pins are disposed between and extended outward from the first encapsulation member and the second encapsulation member. The second insulation layer is disposed between the first encapsulation member and the second encapsulation layer for securing the first encapsulation member, the second encapsulation member, the at least one semiconductor chip, and the plurality of metal pins.

19 Claims, 16 Drawing Sheets

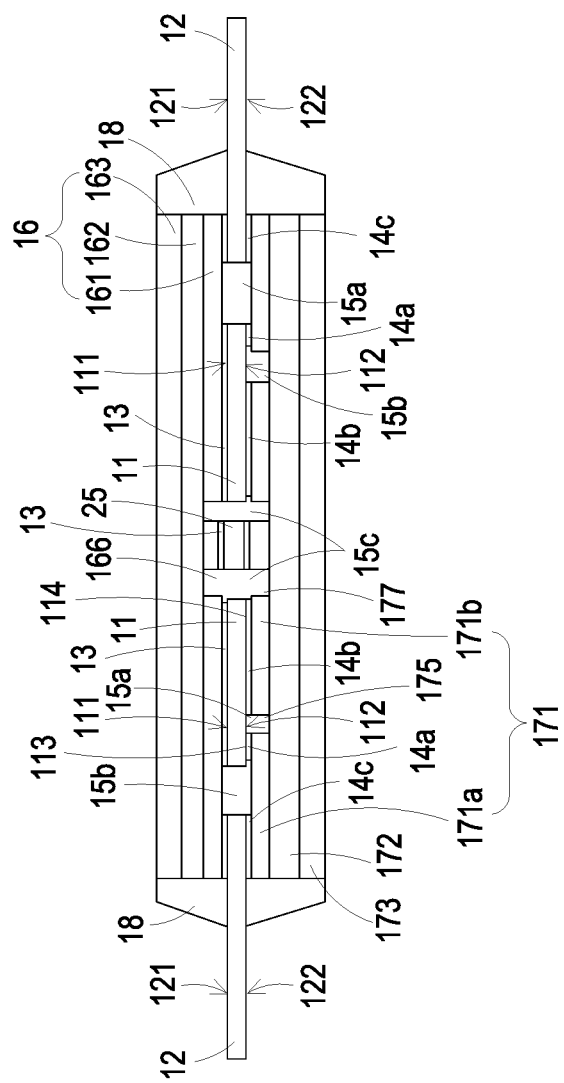

HEAT-DISSIPATING SEMICONDUCTOR PACKAGE INCLUDING A PLURALITY OF METAL PINS BETWEEN FIRST AND SECOND ENCAPSULATION MEMBERS

FIELD OF THE INVENTION

The present disclosure relates to a package structure, and more particularly to a package structure having dual sides cooling mechanism.

BACKGROUND OF THE INVENTION

Recently, the general trends in designing electronic devices are toward small size, light weightiness and easy portability. Moreover, with increasing development of electronic industries, the internal circuitries of the electronic devices are gradually modularized. In other words, plural semiconductor chips are integrated into a single electronic module. For example, a power module is one of the widely-used electronic modules. An example of the power module includes but is not limited to a DC-to-DC converter, a DC-to-AC converter or an AC-to-DC converter. After the semiconductor chips (e.g. integrated circuit (IC) chips, capacitors, resistors, inductors, transformers, diodes and transistors) are integrated as a power module, the power module may be installed on a motherboard or a system circuit board.

Recently, an embedded approach, which is without any bonding wire, is employed in the package structure of the power module to further reduce the package foot-print and enhance the performance at the same time. However, when the semiconductor chip embedded within an insulation layer of the embedded package structure generates a great amount of heat during working, the heat can only be dissipated away along a single side of the package structure, so that the heat dissipating efficiency of the conventional package structure isn't satisfied. Furthermore, the conventional package structure is complex and can't be applied to a flip-chipped semiconductor chip.

Therefore, there is a need of providing an improved package structure in order to address the above issues.

SUMMARY OF THE INVENTION

An object of an embodiment of the present disclosure provides a package structure, in which at least one semiconductor chip is disposed between a first encapsulation member and a second encapsulation member and a dual sides cooling mechanism is employed to dissipate the heat to the surroundings. Consequently, the heat dissipating efficiency is enhanced, and the package structure is simplified.

In accordance with one aspect of an embodiment of the present disclosure, a package structure is provided. The package structure includes a first encapsulation member, a second encapsulation member, at least one semiconductor chip, a plurality of metal pins and a second insulation layer. The first encapsulation member includes a first metal layer, a first insulation layer and a second metal layer, and the first insulation layer is formed between the first metal layer and the second metal layer. The second encapsulation member includes a third metal layer. The at least one semiconductor chip is disposed between the first encapsulation member and the second encapsulation member. The at least one semiconductor chip comprises a plurality of conductive terminals connected with the first metal layer or the third metal layer. The plurality of metal pins are disposed between the first encapsulation member and the second encapsulation member and extended outward from the first encapsulation member and the second encapsulation member. The second insulation layer is disposed between the first encapsulation member and the second encapsulation layer for securing the first encapsulation member, the second encapsulation member, the at least one semiconductor chip, and the plurality of metal pins.

The above contents of the present disclosure will become more readily apparent to those ordinarily skilled in the art after reviewing the following detailed description and accompanying drawings, in which:

BRIEF DESCRIPTION OF THE DRAWINGS

FIG. 20 is a schematic cross-sectional view illustrating a package structure according to a nineteenth embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
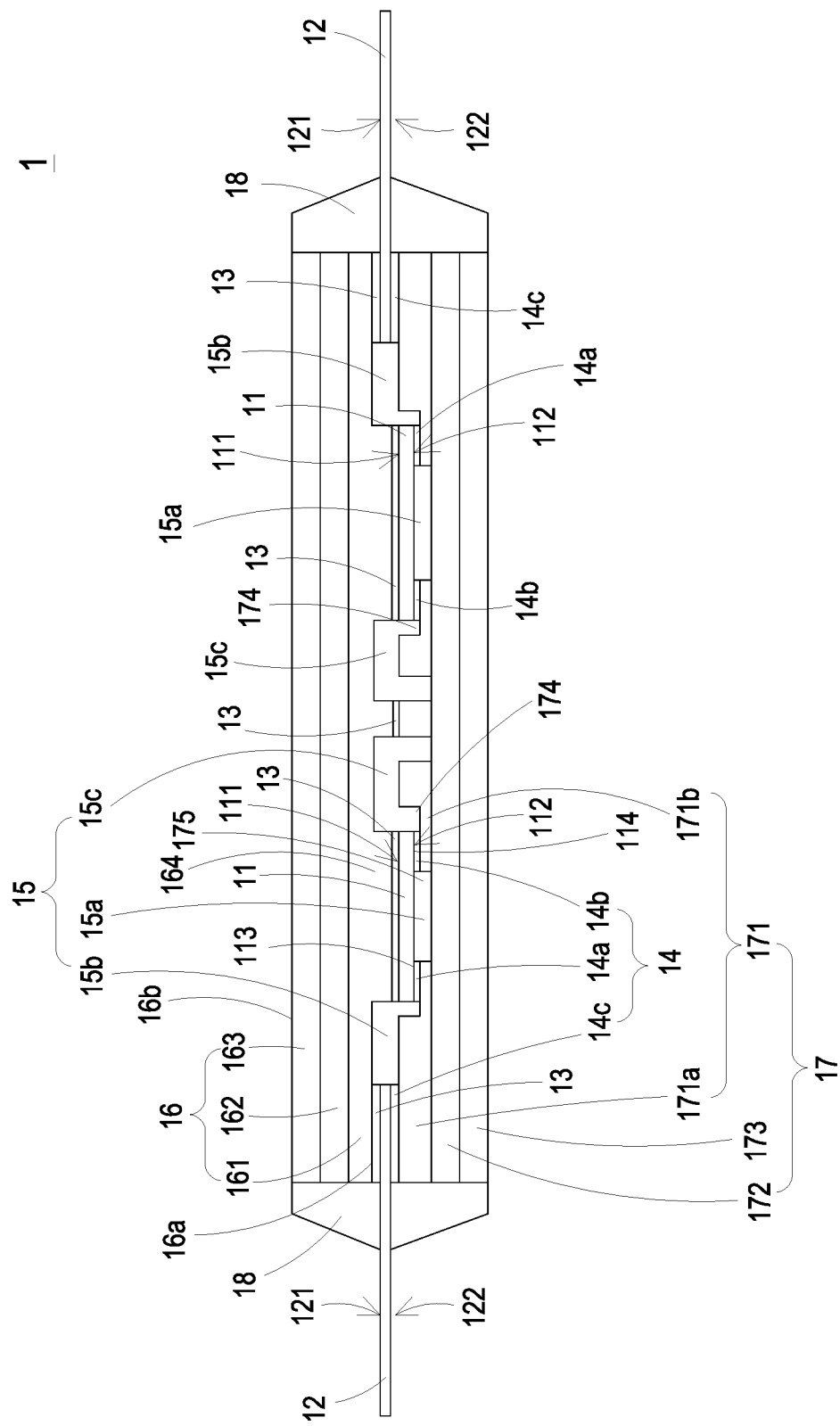
FIG. 1A is a schematic cross-sectional view illustrating a package structure according to a first embodiment of the present disclosure.
Figure 1B:
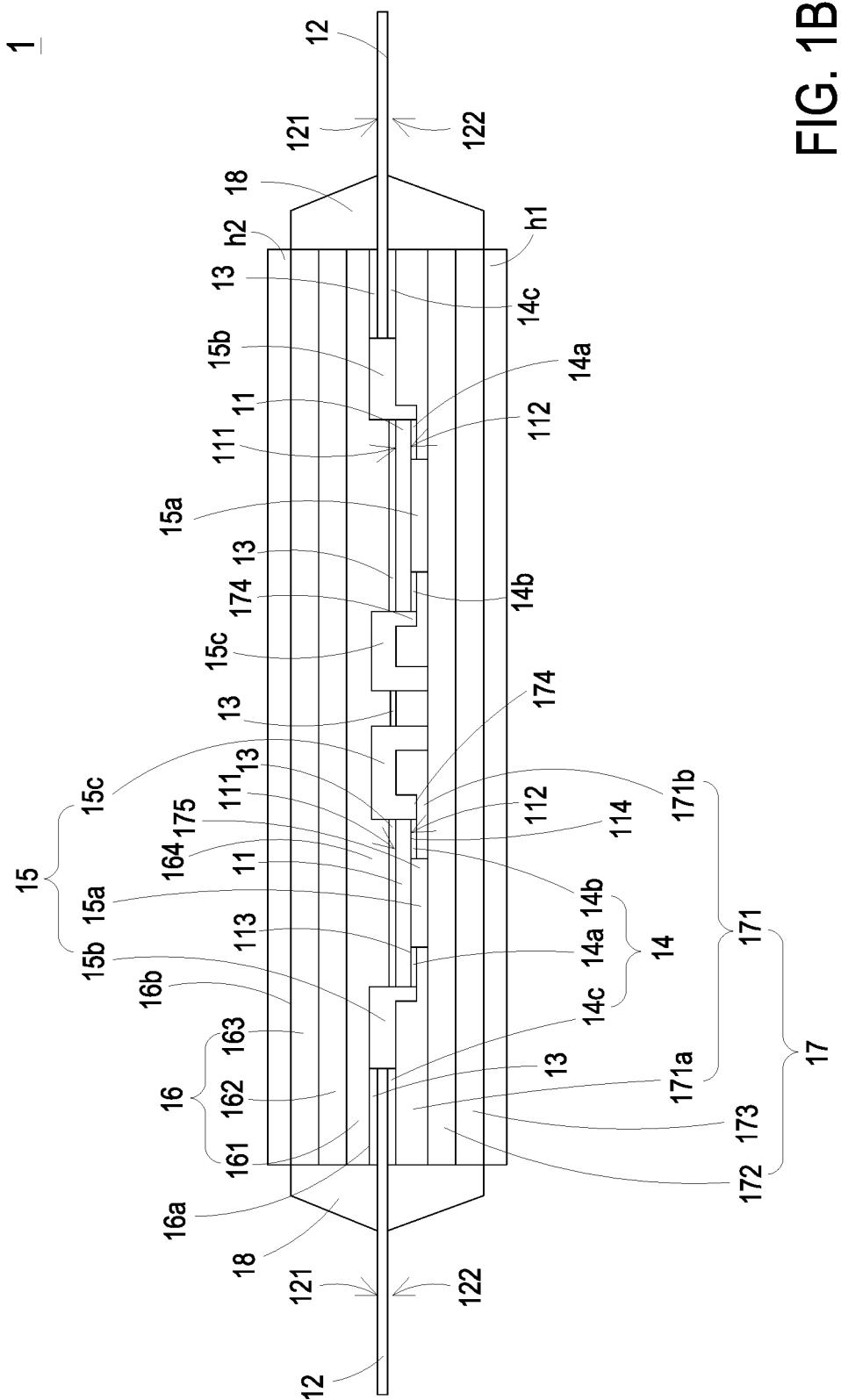
FIG. 1B is a schematic cross-sectional view illustrating a package structure with heat-dissipating devices according to the first embodiment of the present disclosure.

FIG. 1A is a schematic cross-sectional view illustrating a package structure according to a first embodiment of the present disclosure, and FIG. 1B is a schematic cross-sectional view illustrating a package structure with heat-dissipating devices according to the first embodiment of the present disclosure. As shown in FIGS. 1A and 1B, the package structure 1 includes at least one semiconductor chip 11, a plurality of metal pins 12, a first conduction layer 13, a second conduction layer 14, a second insulation layer 15, a first encapsulation member 17 and a second encapsulation member 16.

The semiconductor chip 11 may be an active component or a passive component. An example of the semiconductor chip 11 includes but is not limited to an integrated circuit (IC) chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The semiconductor chip 11 includes a first surface 111, a second surface 112, and a plurality of conductive terminals, for example, at least one first conductive terminal 113 and at least one second conductive terminal 114. The first surface 111 is opposite to the second surface 112. In this embodiment, the semiconductor chip 11 is a lateral device mounted on the first conduction layer 13 in a flip chip manner and the at least one first conductive terminal 113 and the at least one second conductive terminal 114 are disposed on the second surface 112 of the semiconductor chip 11. In another embodiment, the semiconductor chip 11 can be a vertical device and has another conductive terminal located on the first surface 111. The metal pin 12 includes a first surface 121 and a second surface 122. The first surface 121 is opposite to the second surface 122.

The at least one semiconductor chip 11 is disposed between the first encapsulation member 17 and the second encapsulation member 16. The first conduction layer 13, the second conduction layer 14 and the second insulation layer 15 are disposed between the first encapsulation member 17 and the second encapsulation member 16 for securing the first encapsulation member 17, the second encapsulation member 16, the at least one semiconductor chip 11, and the plurality of metal pins 12. The plurality of metal pins 12 are disposed between the first encapsulation member 17 and the second encapsulation member 16 and extended outward from the first encapsulation member 17 and the second encapsulation member 16, and the plurality of metal pins 12 are electrically connected with the plurality of conductive terminals respectively, for example, the at least one first conductive terminal 113 and the at least one second conductive terminal 114. In this embodiment, a part of the first conduction layer 13 is connected between the second encapsulation member 16 and the first surface 111 of the semiconductor chip 11, and the other part of the first conduction layer 13 is connected between the second encapsulation member 16 and a part of the first surface 121 of the metal pin 12. The other part of the first surface 121 of the metal pin 12 is exposed. In this embodiment, the second conduction layer 14 includes a first part 14a, a second part 14b and a third part 14c separated from each other. The first part 14a is disposed between the first encapsulation member 17 and a part of the second surface 112 of the semiconductor chip 11. The first part 14a is in contact with the at least one first conductive terminal 113 of the semiconductor chip 11. The second part 14b is disposed between the first encapsulation member 17 and the other part of the second surface 112 of the semiconductor chip 11. The second part 14b is in contact with the at least one second conductive terminal 114 of the semiconductor chip 11. The third part 14c is disposed between the first encapsulation member 17 and a part of the second surface 122 of the metal pin 12. The other part of the second surface 122 of the metal pin 12 is exposed.

In this embodiment, the second insulation layer 15 includes a first part 15a, a second part 15b and a third part 15c. The first part 15a is disposed among the first encapsulation member 17, the first part 14a of the second conduction layer 14, the second part 14b of the second conduction layer 14 and the semiconductor chip 11. The second part 15b is disposed among the semiconductor chip 11, the metal pin 12, the first encapsulation member 17 and the second encapsulation member 16. The third part 15c is disposed among the semiconductor chip 11, the first encapsulation member 17 and the second encapsulation member 16. The second insulation layer 15 can be made of any appropriate insulation material with high thermal conductivity.

The first encapsulation member 17 includes a first metal layer 171, a first insulation layer 172 and a second metal layer 173. The first metal layer 171 is formed on the first insulation layer 172, and the first insulation layer 172 is formed on the second metal layer 173. Therefore, the first insulation layer 172 is formed between the first metal layer 171 and the second metal layer 173. In this embodiment, the first metal layer 171 is attached to the second conduction layer 14 and the second insulation layer 15. One side of the second metal layer 173 is exposed. In some embodiments, the first encapsulation member 17 is an insulated metal substrate for example a direct bonding copper (DBC) substrate, but not limited thereto. The first insulation layer 172 can be made of any appropriate insulation material with high thermal conductivity. In some embodiments, the package structure 1 further includes a first heat-dissipating device h1 disposed on the exposed side of the second metal layer 173 for dissipating the heat of the package structure 1 along a first heat dissipation channel. Preferably but not exclusively, the first heat-dissipating device is a heatsink, a liquid cooling device or a heat pipe.

The second encapsulation member 16 includes a third metal layer 161, a third insulation layer 162 and a fourth metal layer 163. The third insulation layer 162 is formed on the third metal layer 161, and the fourth metal layer 163 is formed on the third insulation layer 162. The third metal layer 161 is attached to the first conduction layer 13 and the second insulation layer 15. One side of the fourth metal layer 163 is exposed. The second encapsulation member 16 includes a first surface 16a and a second surface 16b. The first surface 16a is opposite to the second surface 16b. The first surface 16a of the second encapsulation member 16 is attached on the first conduction layer 13 and the second insulation layer 15. The second surface 16b of the second encapsulation member 16 is exposed. In some embodiments, the second encapsulation member 16 is an insulated metal substrate for example a direct bonding copper (DBC) substrate, but not limited thereto. In some embodiments, the package structure 1 further includes a second heat-dissipating device h2 disposed on the second surface 16b of the second encapsulation member 16 for dissipating the heat of the package structure 1 along a second heat dissipation channel. Preferably but not exclusively, the second heat-dissipating device is a heatsink, a liquid cooling device or a heat pipe.

As mentioned above, since one side of the first encapsulation member 17 is exposed and connected with the first heat-dissipating device h1 and one side of the second encapsulation member 16 is exposed and connected with the second heat-dissipating device h2, the package structure 1 of the present disclosure employs a dual sides cooling mechanism to dissipate heat to the surroundings. Compared with the conventional package structure, the heat dissipating efficiency of the package structure 1 is enhanced.

In this embodiment, the first metal layer 171 includes a first part 171a, a second part 171b and at least one first groove 174. The first part 171a and the second part 171b are separated from each other by the at least one first groove 174. The first part 14a of the second conduction layer 14 is disposed in the first groove 174 and connected between the first part 171a of the first metal layer 171 and the at least one first conductive terminal 113 of the semiconductor chip 11. The second part 14b of the second conduction layer 14 is disposed in the first groove 174 and connected between the second part 171b of the first metal layer 171 and the at least one second conductive terminal 114 of the semiconductor chip 11. In an embodiment, a depth of the first groove 174 is designed based on a thickness of the semiconductor chip 11 for keeping the first surface 111 of the semiconductor chip 11 coplanar with the top surface of the first metal layer 171 so as to facilitate the following process of combining the first encapsulation member 17 and the second encapsulation member 16. The third metal layer 161 includes at least one first protrusion 164 disposed corresponding in position to the first groove 174. Moreover, the first metal layer 171 further includes a second groove 175 disposed in the first groove 174. The first part 15a of the second insulation layer 15 is disposed within the second groove 175 and disposed among the first insulation layer 172 of the first encapsulation member 17, the first part 171a of the first metal layer 171, the second part 171b of the first metal layer 171, the first part 14a of the second conduction layer 14, the second part 14b of the second conduction layer 14 and portion of the second surface 112 of the semiconductor chip 11, so that the first part 171a and the second part 171b of the first metal layer 171 are separated from each other. The semiconductor chip 11 is accommodated in the first groove 174 and the first surface 111 of the semiconductor chip 11 is coplanar with one surface of the first metal layer 171. Since the first metal layer 171 includes at least one first groove 174, the semiconductor chip 11 is accommodated in the first groove 174 and connected to the metal pin 12 through the first part 14a of the second conduction layer 14, the first part 171a of the first metal layer 171 and the third part 14c of the second conduction layer 14. Therefore, the package structure 1 is thinned and has better stress resistance for the embedded flip-chipped semiconductor chip 11. Moreover, the line space ratio of conductive trace of the package structure 1 is better.

In some embodiments, the package structure 1 further includes at least one insulation structure 18. The insulation structure 18 is disposed on the lateral sides of the first encapsulation member 17 and the second encapsulation member 16 and surrounds portion of the metal pin 12. A part of the metal pin 12 is disposed between the first conduction layer 13 and the third part 14c of the second conduction layer 14, another part of the metal pin 12 is embedded in the insulation structure 18, and the other part of the metal pin 12 is exposed. The metal pin 12 is connected to the at least one first conductive terminal 113 of the semiconductor chip 11 through the third part 14c of the second conduction layer 14, the first part 171a of the first metal layer 171 and the first part 14a of the second conduction layer 14, so that the metal pin 12 can be served as a pin-out of the package structure 1. In some embodiments, the material type of the insulation structure 18 is the same with the material type of the second insulation layer 15. In other embodiments, the material type of the insulation structure 18 is different with the material type of the second insulation layer 15.

In this embodiment, the number of the at least one semiconductor chip 11 is two. The two semiconductor chips 11 are arranged horizontally and disposed between the first encapsulation member 17 and the second encapsulation member 16. It is noted that the number of the at least one semiconductor chip 11 is not limited to the above embodiment and can be varied according to the practical requirements.

Figure 2A:
FIGS. 2A to 2E are schematic cross-sectional views illustrating a packaging process for the package structure of FIG. 1.

FIGS. 2A to 2E are schematic cross-sectional views illustrating a packaging process for the package structure of FIG. 1. Firstly, as shown in FIG. 2A, a first encapsulation member 17 and a second encapsulation member 16 are provided. In this embodiment, the first encapsulation member 17 includes a first metal layer 171, a first insulation layer 172 and a second metal layer 173, wherein the first metal layer 171 is formed on the first insulation layer 172, and the first insulation layer 172 is formed on the second metal layer 173. Therefore, the first insulation layer 172 is formed between the first metal layer 171 and the second metal layer 173. The second encapsulation member 16 includes a third metal layer 161, a third insulation layer 162 and a fourth metal layer 163, wherein the fourth metal layer 163 is formed on the third insulation layer 162, and the third insulation layer 162 is formed on the third metal layer 161.

Figure 2B:
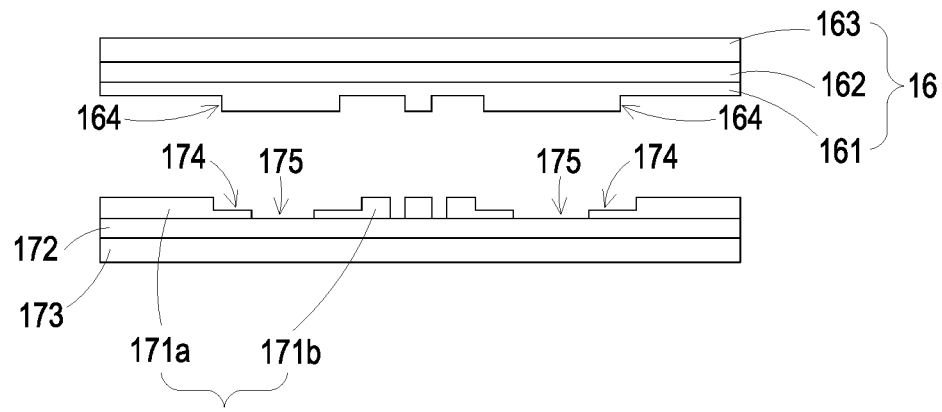

Then, as shown in FIG. 2B, the first encapsulation member 17 and the second encapsulation member 16 are performed with a patterning process, respectively. In this embodiment, the patterning process may include a step etching process. Alternatively, the patterning process may include an etching process and a metal plating process. In this embodiment, at least one first groove 174 and at least one second groove 175 are formed in the first metal layer 171 of the first encapsulation member 17, and at least one first protrusion 164 is formed on the third metal layer 161 of the second encapsulation member 16. The at least one first protrusion 164 is corresponding in position to the first groove 174. The second groove 175 is located in the first groove 174, and portion of the first insulation layer 172 is exposed through the first groove 174 and the second groove 175. The first metal layer 171 includes a first part 171a and a second part 171b separated from each other by the first groove 174 and the second groove 175.

Figure 2C:
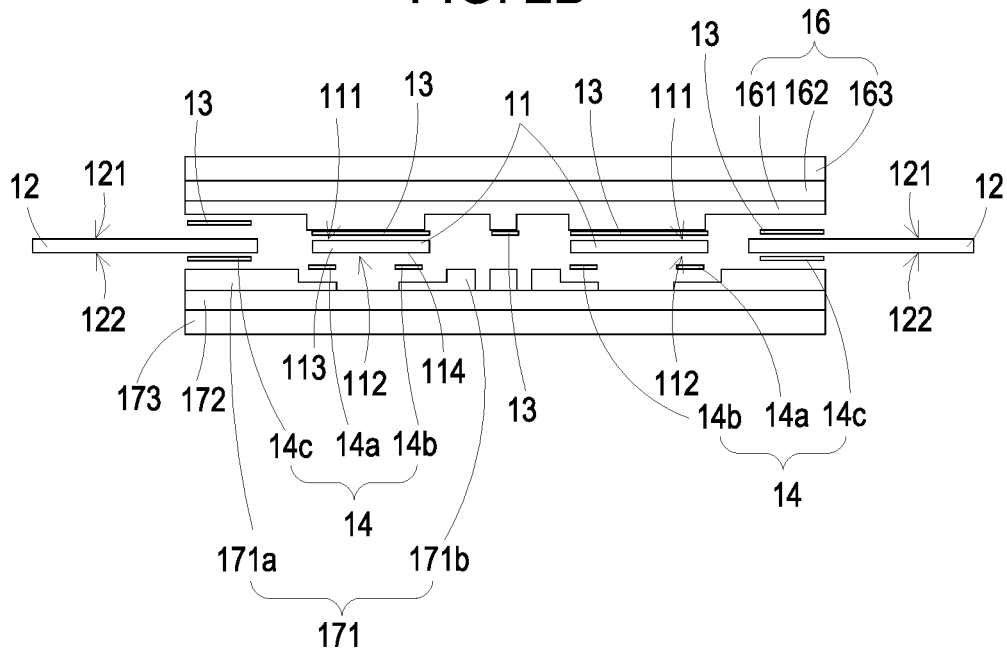

Then, as shown in FIG. 2C, at least one semiconductor chip 11, at least one metal pin 12, a first conduction layer 13 and a second conduction layer 14 are provided and disposed between the first encapsulation member 17 and the second encapsulation member 16. In this embodiment, a part of the first conduction layer 13 is disposed between the third metal layer 161 of the second encapsulation member 16 and the first surface 111 of the semiconductor chip 11, and the other part of the first conduction layer 13 is disposed between the third metal layer 161 of the second encapsulation member 16 and a part of the first surface 121 of the metal pin 12. The second conduction layer 14 includes a first part 14a, a second part 14b and a third part 14c separated from each other. The first part 14a is disposed between the first part 171a of the first metal layer 171 and the at least one first conductive terminal 113 of the semiconductor chip 11. The second part 14b is disposed between the second part 171b of the first metal layer 171 and the at least one second conductive terminal 114 of the semiconductor chip 11. The third part 14c is disposed between the first part 171a of the first metal layer 171 and a part of the second surface 122 of the metal pin 12. The semiconductor chip 11 is disposed between and corresponding in position to the first protrusion 164 and the first groove 174. In this embodiment, the first conduction layer 13 and the second conduction layer 14 are conductive pastes or conductive films, but not limited thereto.

Figure 2D:
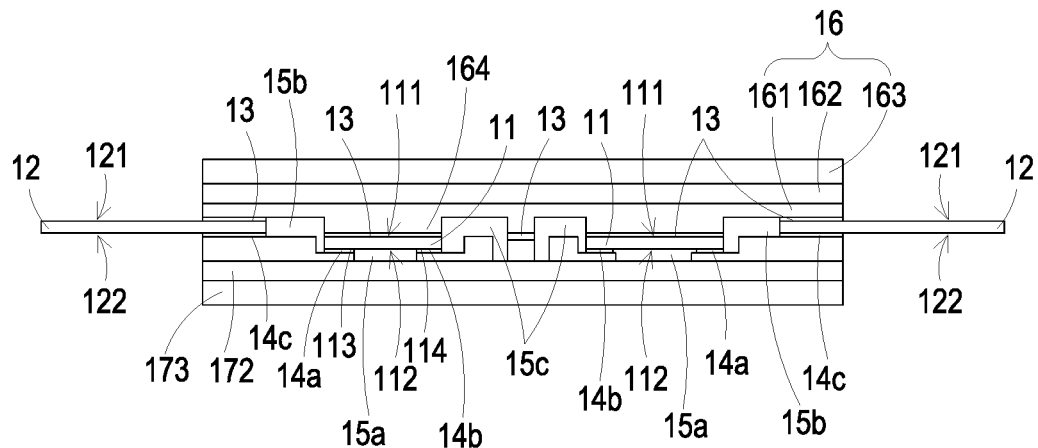

Then, as shown in FIG. 2D, a pressing process and a curing process are performed, so that the at least one semiconductor chip 11, the at least one metal pin 12, the first conduction layer 13, the second conduction layer 14, the first encapsulation member 17 and the second encapsulation member 16 are combined together. In this embodiment, a part of the first conduction layer 13 is connected between the first protrusion 164 of the third metal layer 161 and the first surface 111 of the semiconductor chip 11, and the other part of the first conduction layer 13 is connected between the third metal layer 161 and the first surface 121 of the metal pin 12. The first part 14a is connected between the first part 171a of the first metal layer 171 and the at least one first conductive terminal 113 of the semiconductor chip 11. The second part 14b is connected between the second part 171b of the first metal layer 171 and the at least one second conductive terminal 114 of the semiconductor chip 11. The third part 14c is connected between the first part 17a of the first metal layer 171 and the second surface 122 of the metal pin 12. The semiconductor chip 11 is accommodated in the first groove 174 and the first surface 111 of the semiconductor chip 11 is coplanar with one surface of the first metal layer 171.

Figure 2E:
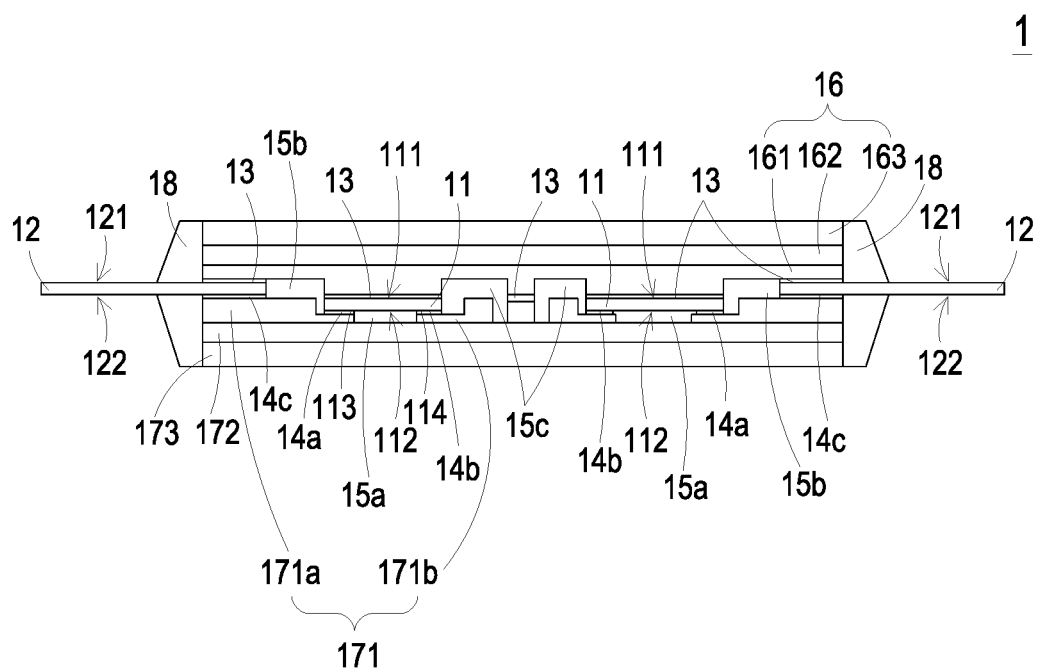

Then, as shown in FIG. 2E, a filling process is performed so that a second insulation layer 15 is disposed between the first encapsulation member 17 and the second encapsulation member 16. Then, at least one insulation structure 18 is formed on the lateral sides of the first encapsulation member 17 and the second encapsulation member 16 and surrounds portion of the metal pin 12 for allowing portion of the metal pin 12 to be exposed. Consequently, the package structure 1 is formed. In this embodiment, the second insulation layer 15 includes a first part 15a, a second part 15b and a third part 15c. The first part 15a is disposed among the first part 171a of the first metal layer 171, the second part 171b of the first metal layer 171, portion of the first insulation layer 172, the first part 14a of the second conduction layer 14, the second part 14b of the second conduction layer 14 and portion of the second surface 112 of the semiconductor chip 11. The second part 15b is disposed among the semiconductor chip 11, the metal pin 12, the first conduction layer 13, the third metal layer 161, the first part 171a of the first metal layer 171, the first part 14a of the second conduction layer 14 and the third part 14c of the second conduction layer 14. The third part 15c is disposed among the semiconductor chip 11, the third metal layer 161, the second part 171b of the first metal layer 171, the second part 14b of the second conduction layer 14 and the first conduction layer 13. In this embodiment, a part of the metal pin 12 are disposed between the first conduction layer 13 and the third part 14c of the second conduction layer 14, another part of the metal pin 12 is embedded in the insulation structure 18, and the other part of the metal pin 12 is exposed. The metal pin 12 is connected to the at least one first conductive terminal 113 of the semiconductor chip 11 through the third part 14c of the second conduction layer 14, the first part 171a of the first metal layer 171 and the first part 14a of the second conduction layer 14, so that the metal pin 12 can be served as a pin-out of the package structure 1. Consequently, the package structure 1 is formed. From above, the insulation structure 18 is formed after the second insulation layer 15 is formed. In some embodiments, the second insulation layer 15 and the insulation structure 18 are formed by one step process at the same time.

Figure 3:
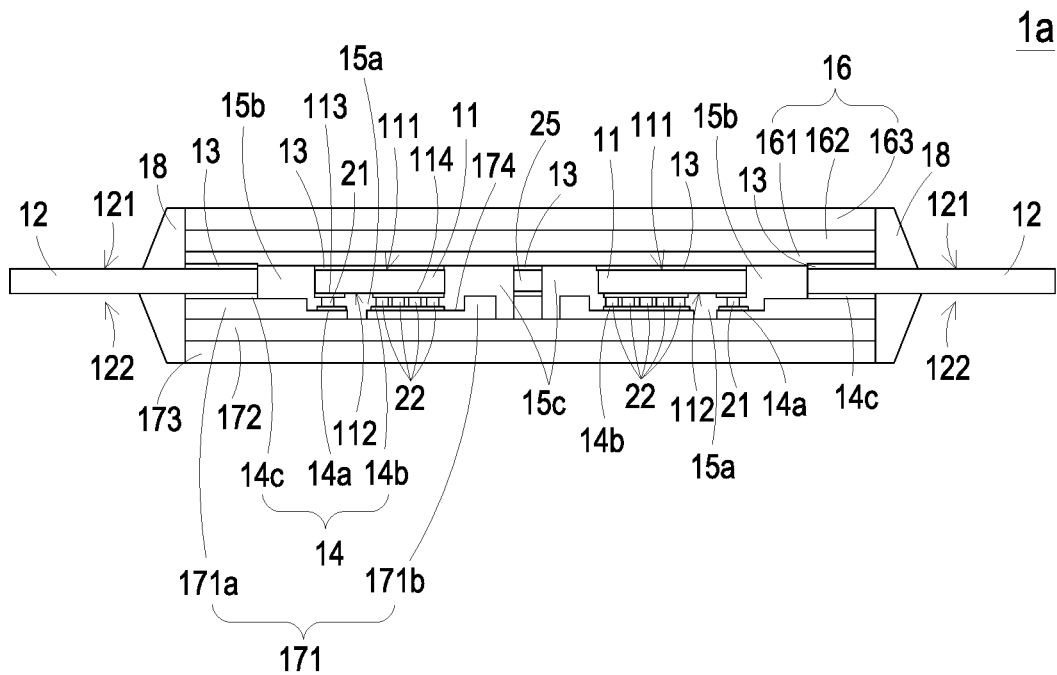
FIG. 3 is a schematic cross-sectional view illustrating a package structure according to a second embodiment of the present disclosure.

FIG. 3 is a schematic cross-sectional view illustrating a package structure according to a second embodiment of the present disclosure. Component parts and elements corresponding to those of the first embodiment are designated by identical numeral references, and detailed descriptions thereof are omitted. As shown in FIG. 3, comparing with the package structure 1 of FIG. 1, the package structure 1a of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of second conductive terminals 114 of the semiconductor chip 11. The first protrusion 164 of the third metal layer 161 is omitted. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. In addition, the first surface 111 of the semiconductor chip 11 is coplanar with the first surface 121 of the metal pin 12. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1 is better. In addition, at least one ultra-thin flip-chipped IC can be embedded in the package structure 1a so that the die attachment material shortage issue is prevented.

In some embodiments, a surface finish is performed between the first conductive terminal 113 of the semiconductor chip 11 and the first conductive pillar 21 for connecting the first conductive terminal 113 of the semiconductor chip 11 and the first conductive pillar 21. The surface finish is also performed between the second conductive terminals 114 of the semiconductor chip 11 and the second conductive pillars 22 for connecting the second conductive terminals 114 of the semiconductor chip 11 and the second conductive pillars 22. In some embodiments, a solder ball is disposed between the first conductive pillar 21 and the first part 14a of the second conduction layer 14 for connecting the first conductive pillar 21 and the first part 14a of the second conduction layer 14. The solder balls are also disposed between the second conductive pillars 22 and the second part 14b of the second conduction layer 14 for connecting the second conduction pillars 22 and the second part 14b of the second conduction layer 14. In some embodiments, the first metal layer 171 is patterned to several parts. Also, a spacer 25 is formed between the first metal layer 171 and the third metal layer 161 for electrically connecting a part of first metal layer 171 and the third metal layer 161 according to the circuit design.

Figure 4:
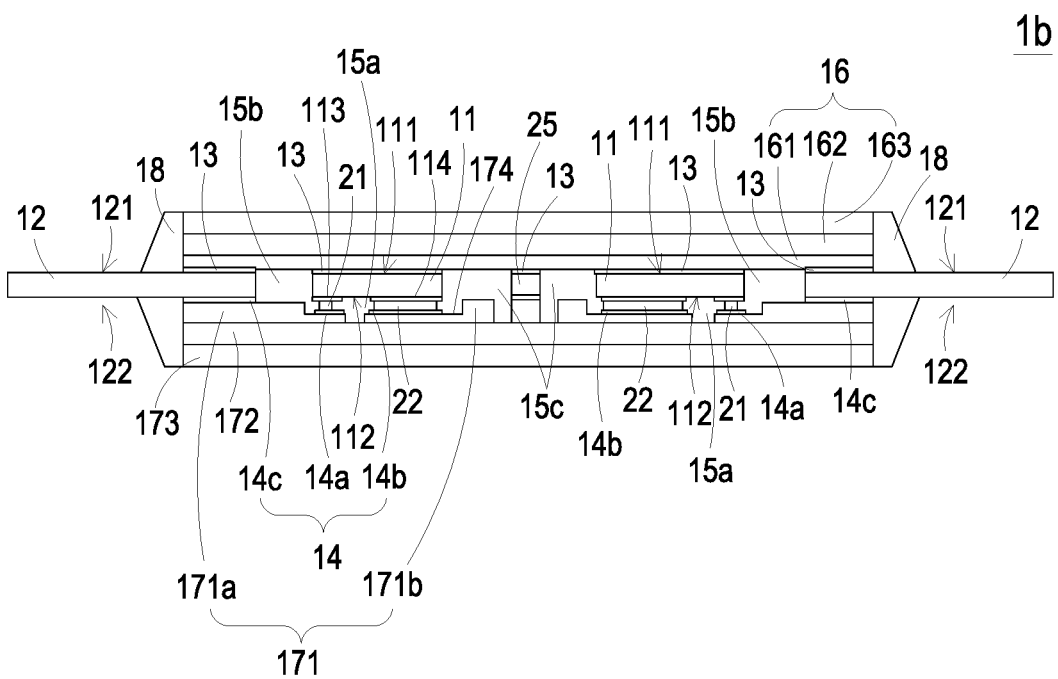
FIG. 4 is a schematic cross-sectional view illustrating a package structure according to a third embodiment of the present disclosure.

FIG. 4 is a schematic cross-sectional view illustrating a package structure according to a third embodiment of the present disclosure. Component parts and elements corresponding to those of the first embodiment are designated by identical numeral references, and detailed descriptions thereof are omitted. As shown in FIG. 4, comparing with the package structure 1a of FIG. 3, the package structure 1b includes a single first conduction pillar 21 and a single second conduction pillar 22. The second conduction pillar 22 is connected between the plurality of the second conductive terminals 114 of the semiconductor chip 11 and the second part 14b of the second conduction layer 14.

Figure 5:
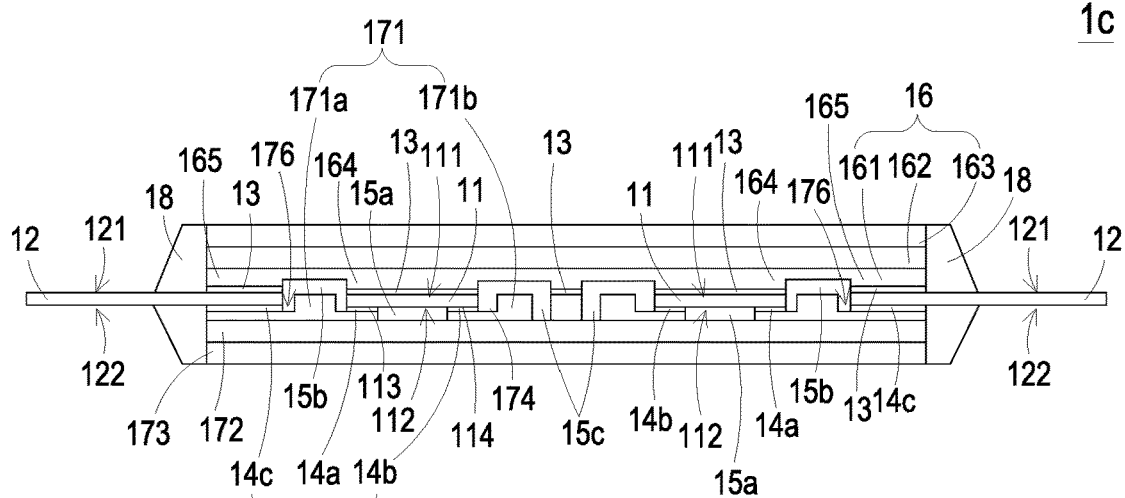
FIG. 5 is a schematic cross-sectional view illustrating a package structure according to a fourth embodiment of the present disclosure.

FIG. 5 is a schematic cross-sectional view illustrating a package structure according to a fourth embodiment of the present disclosure. Component parts and elements corresponding to those of the first embodiment are designated by identical numeral references, and detailed descriptions thereof are omitted. As shown in FIG. 5, comparing with the package structure 1 of FIG. 1, the first metal layer 171 of the package structure 1c further includes at least one recess 176 disposed adjacent to the peripheral of the first encapsulation member 17. The third metal layer 161 further includes at least one second protrusion 165 corresponding in position to the recess 176 of the first metal layer 171. A part of the metal pin 12 is disposed in the recess 176, and the semiconductor chip 11 is disposed in the first groove 174. The first surface 111 of the semiconductor chip 11 is coplanar with the first surface 121 of the metal pin 12.

Figure 6:
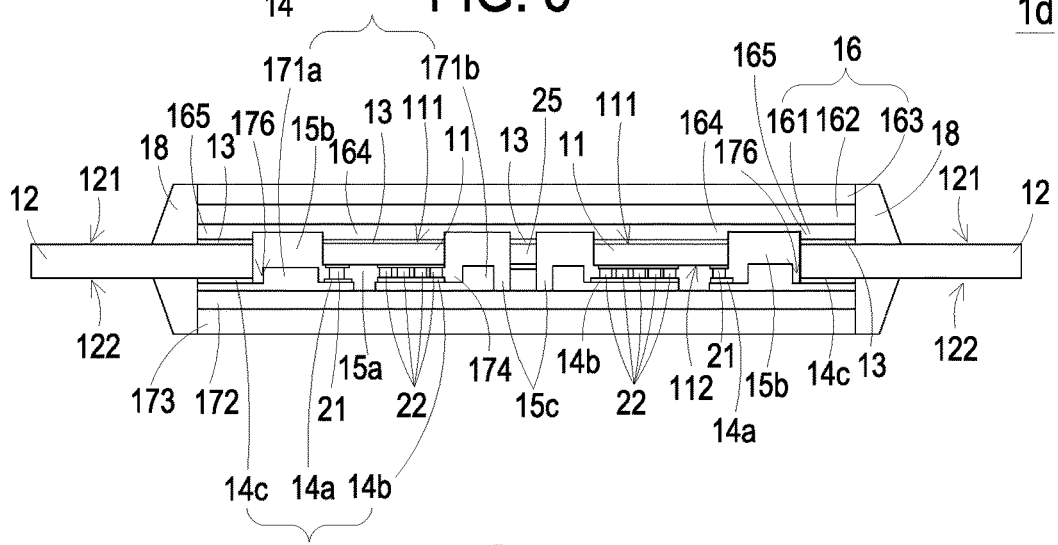
FIG. 6 is a schematic cross-sectional view illustrating a package structure according to a fifth embodiment of the present disclosure.

FIG. 6 is a schematic cross-sectional view illustrating a package structure according to a fifth embodiment of the present disclosure. Component parts and elements corresponding to those of the first embodiment are designated by identical numeral references, and detailed descriptions thereof are omitted. As shown in FIG. 6, comparing with the package structure 1c of FIG. 5, the package structure 1d of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. The first surface 111 of the semiconductor chip 11 is coplanar with the first surface 121 of the metal pin 12. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1d is better. In addition, at least one ultra-thin flip-chipped IC can be embedded in the package structure 1d so that the die attachment material shortage issue is prevented.

Figure 7:
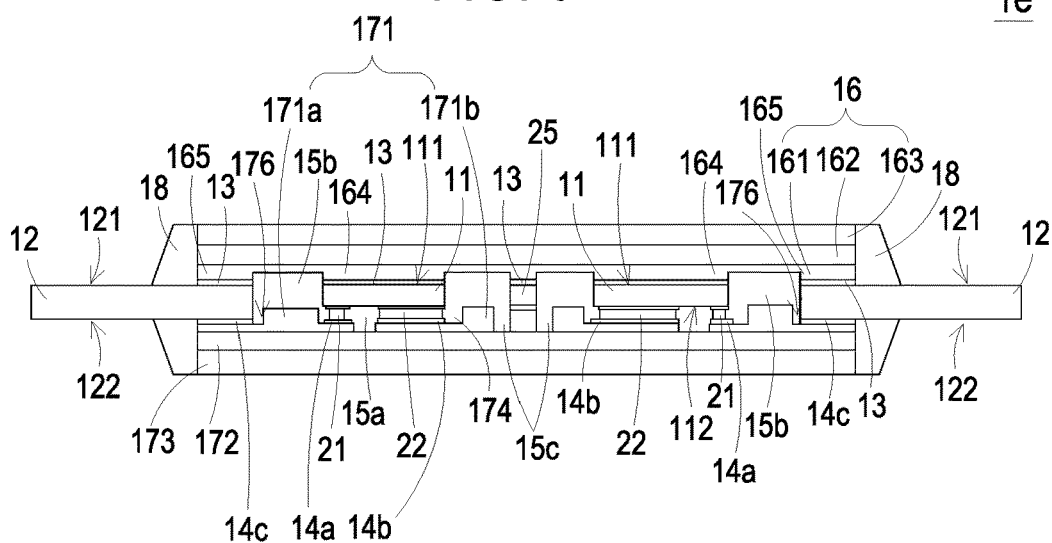
FIG. 7 is a schematic cross-sectional view illustrating a package structure according to a sixth embodiment of the present disclosure.

FIG. 7 is a schematic cross-sectional view illustrating a package structure according to a sixth embodiment of the present disclosure. Component parts and elements corresponding to those of the first embodiment are designated by identical numeral references, and detailed descriptions thereof are omitted. As shown in FIG. 7, comparing with the package structure 1d of FIG. 6, the package structure 1e includes a first conduction pillar 21 and a single second conduction pillar 22. The second conduction pillar 22 is connected between the plurality of second conductive terminals 114 of the semiconductor chip 11 and the second part 14b of the second conduction layer 14.

Figure 8:
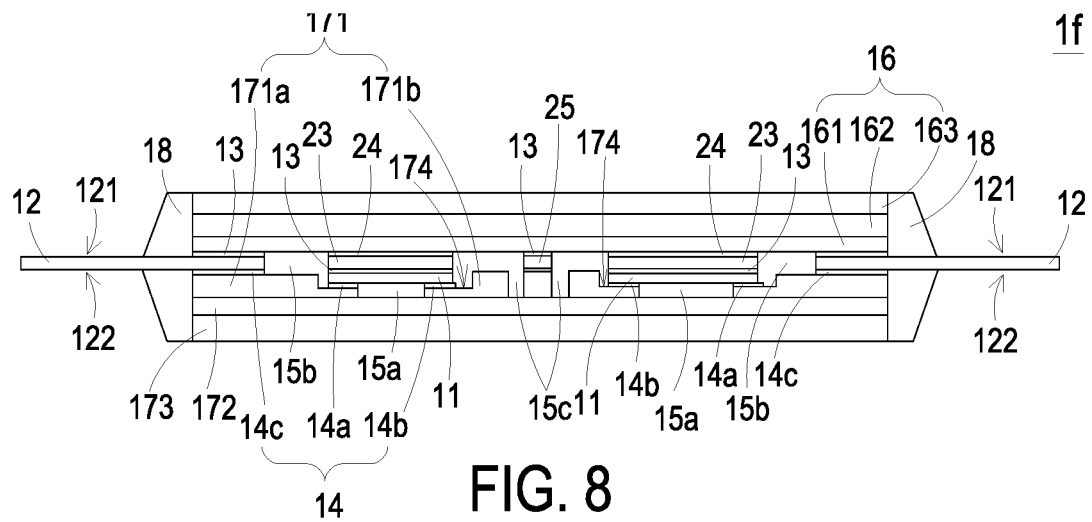
FIG. 8 is a schematic cross-sectional view illustrating a package structure according to a seventh embodiment of the present disclosure.

FIG. 8 is a schematic cross-sectional view illustrating a package structure according to a seventh embodiment of the present disclosure. Component parts and elements corresponding to those of the first embodiment are designated by identical numeral references, and detailed descriptions thereof are omitted. As shown in FIG. 8, comparing with the package structure 1 of FIG. 1, the package structure 1f of this embodiment further includes a conduction spacer 23 and a third conduction layer 24. The first protrusion 164 of the third metal layer 161 is omitted. The conduction spacer 23 is disposed between the semiconductor chip 11 and the third metal layer 161 of the second encapsulation member 16. The first conduction layer 13 is connected between the semiconductor chip 11 and the conduction spacer 23. The third conduction layer 24 is connected between the conduction spacer 23 and the third metal layer 161. One surface of the conduction spacer 23 is coplanar with the first surface 121 of the metal pin 12.

Figure 9:
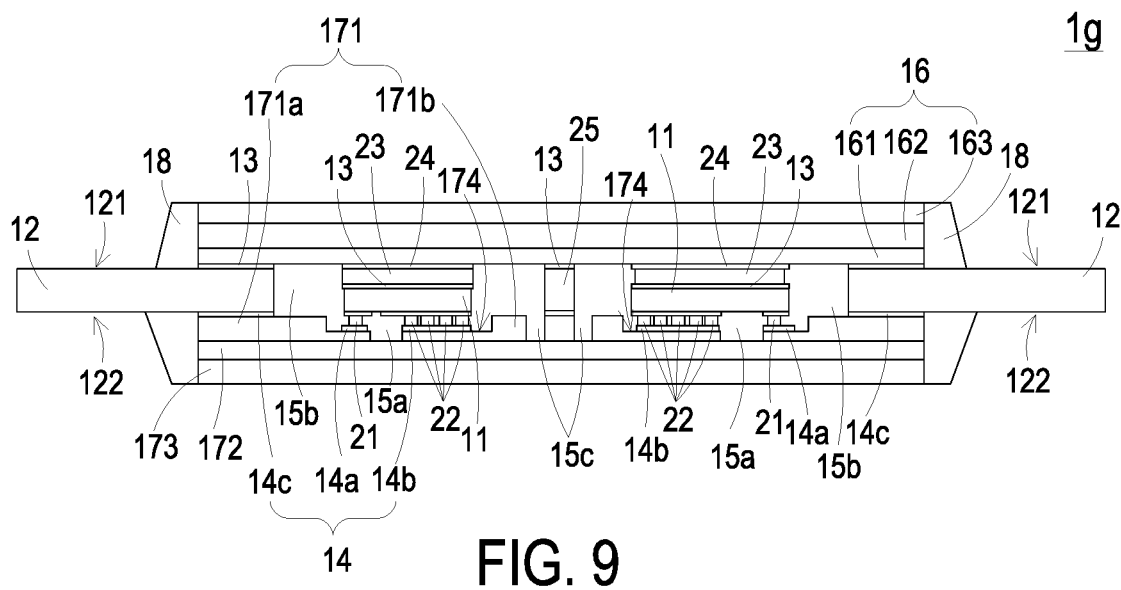
FIG. 9 is a schematic cross-sectional view illustrating a package structure according to an eighth embodiment of the present disclosure.

FIG. 9 is a schematic cross-sectional view illustrating a package structure according to an eighth embodiment of the present disclosure. Component parts and elements corresponding to those of the first embodiment are designated by identical numeral references, and detailed descriptions thereof are omitted. As shown in FIG. 9, comparing with the package structure 1f of FIG. 8, the package structure 1g of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1g is better. In addition, at least one ultra-thin flip-chipped IC can be embedded in the package structure 1g so that the die attachment material shortage issue is prevented.

Figure 10:
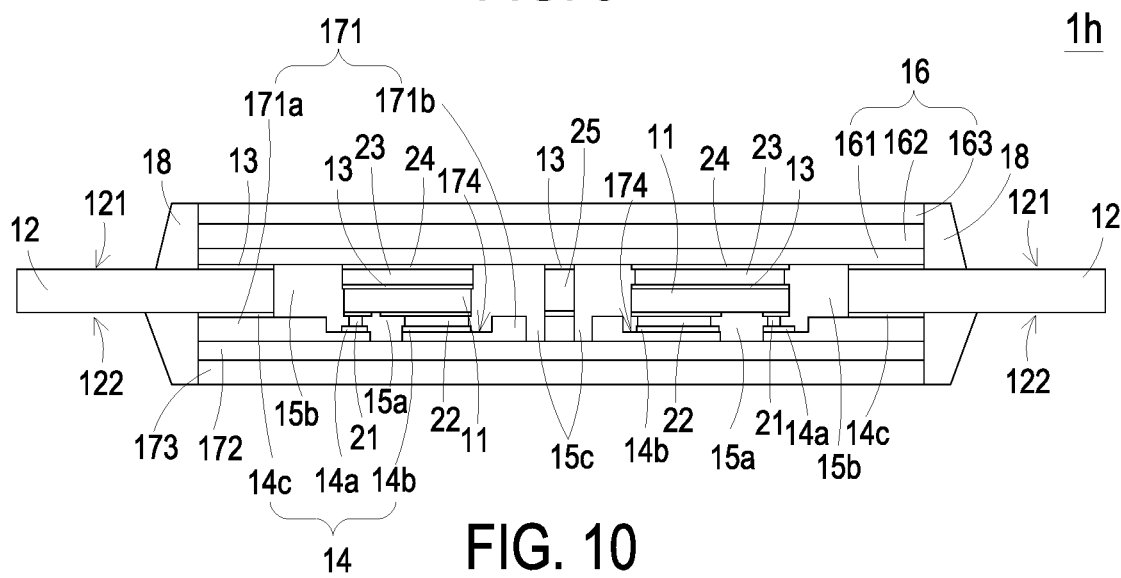
FIG. 10 is a schematic cross-sectional view illustrating a package structure according to a ninth embodiment of the present disclosure.

FIG. 10 is a schematic cross-sectional view illustrating a package structure according to a ninth embodiment of the present disclosure. Component parts and elements corresponding to those of the first embodiment are designated by identical numeral references, and detailed descriptions thereof are omitted. As shown in FIG. 10, comparing with the package structure 1g of FIG. 9, the package structure 1h includes a first conduction pillar 21 and a single second conduction pillar 22. The second conduction pillar 22 is connected between the plurality of second conductive terminals 114 of the semiconductor chip 11 and the second part 14b of the second conduction layer 14.

Figure 11:
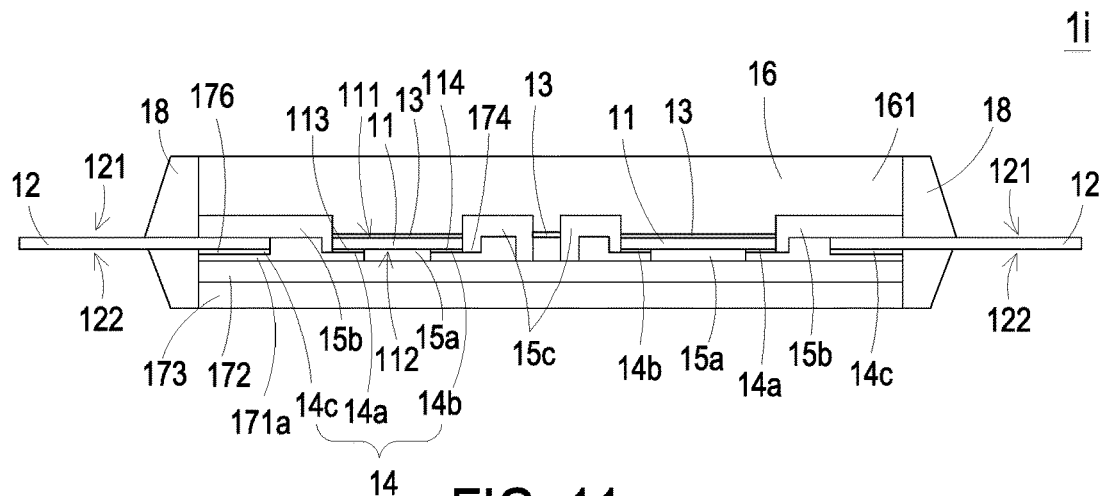
FIG. 11 is a schematic cross-sectional view illustrating a package structure according to a tenth embodiment of the present disclosure.

FIG. 11 is a schematic cross-sectional view illustrating a package structure according to a tenth embodiment of the present disclosure. Component parts and elements corresponding to those of the first embodiment are designated by identical numeral references, and detailed descriptions thereof are omitted. As shown in FIG. 11, comparing with the package structure 1c of FIG. 5, the second encapsulation member 16 of the package structure 1i of this embodiment only includes the third metal layer 161, and the third insulation layer 162 and the fourth metal layer 163 are omitted. One side of the third metal layer 161 is attached to the first conduction layer 13 and the second insulation layer 15. The other side of the third metal layer 161 is exposed. The second part 15b of the second insulation layer 15 is further disposed between the first surface 121 of the metal pin 12 and the third metal layer 161. The semiconductor chip 11 is disposed in the first groove 174, and the part of the metal pin 12 is disposed in the recess 176. The first surface 111 of the semiconductor chip 11 is coplanar with the first surface 121 of the metal pin 12. Since the second encapsulation member 16 of the package structure 1i only includes the third metal layer 161, the heat dissipating efficiency of the package structure 1i is better.

Figure 12:
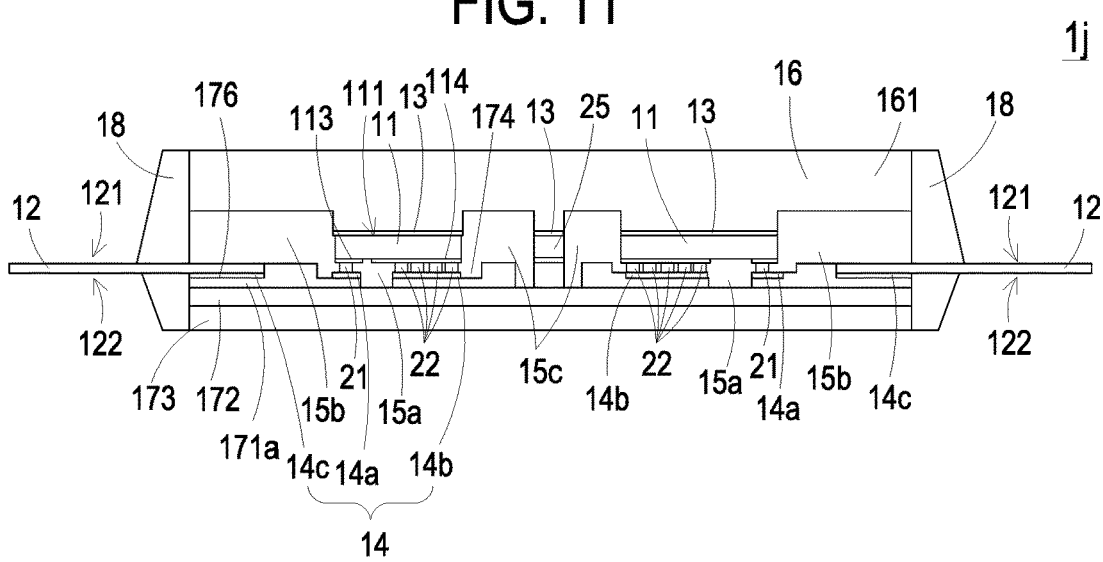
FIG. 12 is a schematic cross-sectional view illustrating a package structure according to an eleventh embodiment of the present disclosure.

FIG. 12 is a schematic cross-sectional view illustrating a package structure according to an eleventh embodiment of the present disclosure. Component parts and elements corresponding to those of the first embodiment are designated by identical numeral references, and detailed descriptions thereof are omitted. As shown in FIG. 12, comparing with the package structure 1i of FIG. 11, the package structure 1j of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1j is better. In addition, at least one ultra-thin flip-chipped IC can be embedded in the package structure 1j so that the die attachment material shortage issue is prevented.

Figure 13:
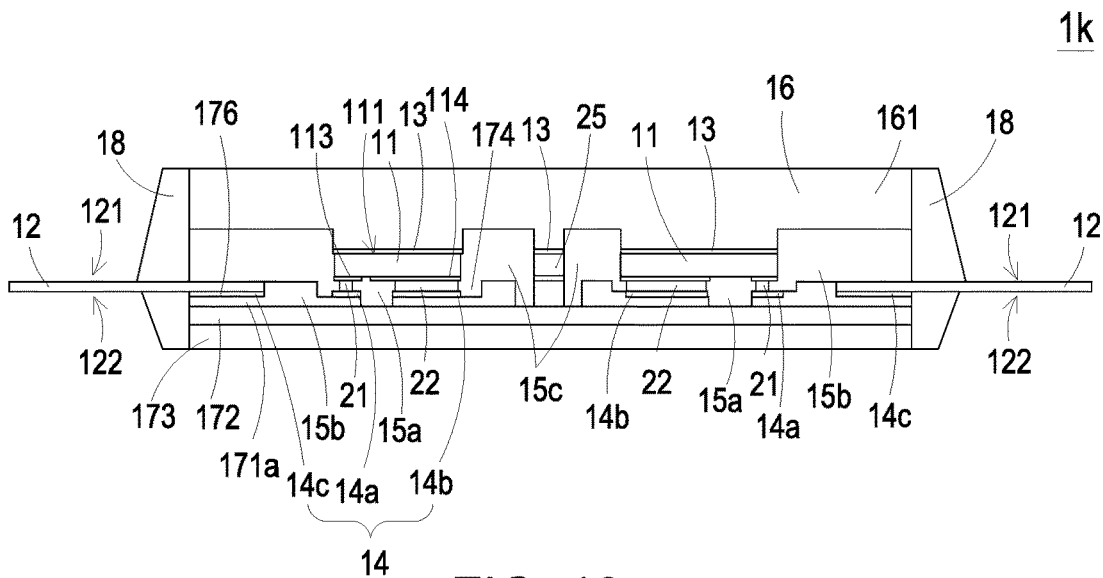
FIG. 13 is a schematic cross-sectional view illustrating a package structure according to a twelfth embodiment of the present disclosure.

FIG. 13 is a schematic cross-sectional view illustrating a package structure according to a twelfth embodiment of the present disclosure. Component parts and elements corresponding to those of the first embodiment are designated by identical numeral references, and detailed descriptions thereof are omitted. As shown in FIG. 13, comparing with the package structure 1j of FIG. 12, the package structure 1k includes a first conduction pillar 21 and a single second conduction pillar 22. The second conduction pillar 22 is connected between the plurality of second conductive terminals 114 of the semiconductor chip 11 and the second part 14b of the second conduction layer 14.

Figure 14:
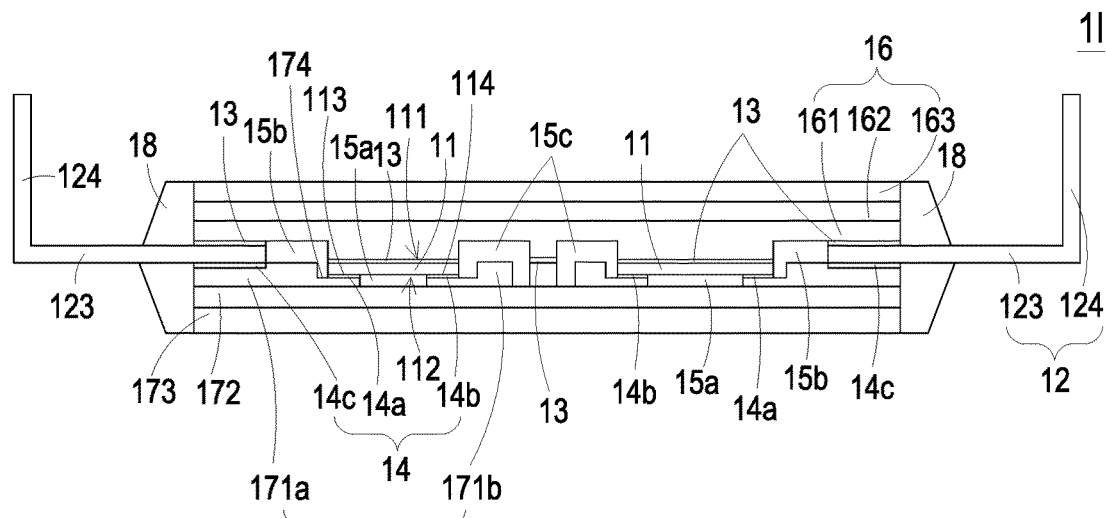
FIG. 14 is a schematic cross-sectional view illustrating a package structure according to a thirteenth embodiment of the present disclosure.

FIG. 14 is a schematic cross-sectional view illustrating a package structure according to a thirteenth embodiment of the present disclosure. Component parts and elements corresponding to those of the first embodiment are designated by identical numeral references, and detailed descriptions thereof are omitted. As shown in FIG. 14, comparing with the package structure 1 of FIG. 1, the metal pin 12 of the package structure 1l includes a first part 123 and a second part 124. A portion of the first part 123 is disposed between the first conduction layer 13 and the third part 14c of the second conduction layer 14, another portion of the first part 123 is embedded within the insulation structure 18, and the other portion of the first part 123 is exposed. The second part 124 is vertically connected with one end of the first part 123 and extended outwardly. The first part 123 and the second part 124 are formed into L-shaped. In this embodiment, the second part 124 of the metal pin 12 can be inserted into a corresponding via hole of a circuit board (not shown).

Figure 15:
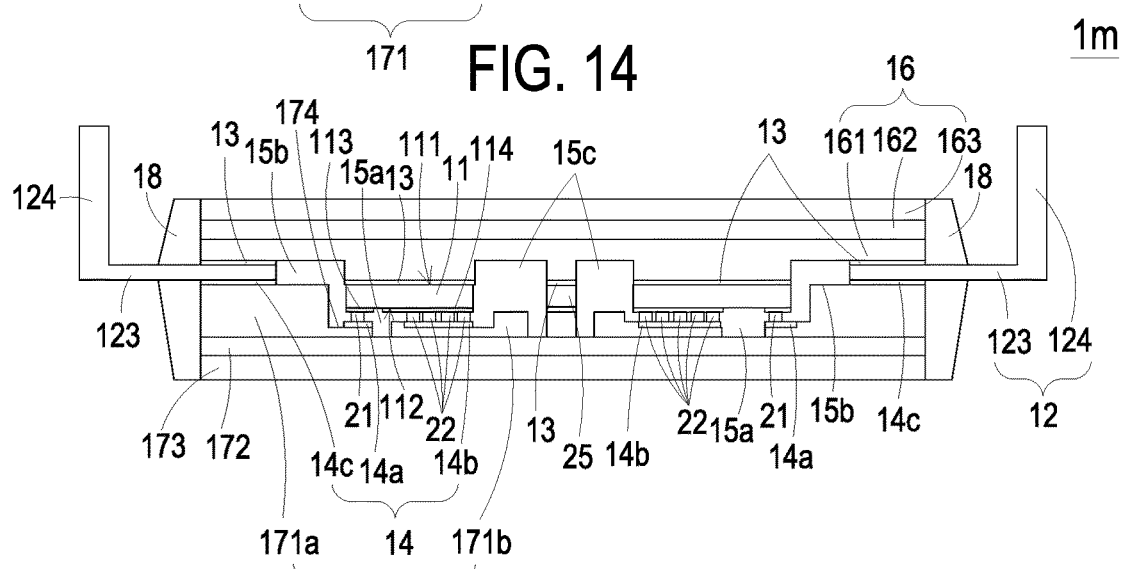
FIG. 15 is a schematic cross-sectional view illustrating a package structure according to a fourteenth embodiment of the present disclosure.

FIG. 15 is a schematic cross-sectional view illustrating a package structure according to a fourteenth embodiment of the present disclosure. Component parts and elements corresponding to those of the first embodiment are designated by identical numeral references, and detailed descriptions thereof are omitted. As shown in FIG. 15, comparing with the package structure 1l of FIG. 14, the package structure 1m of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1m is better. In addition, at least one ultra-thin flip-chipped IC can be embedded in the package structure 1m so that the die attachment material shortage issue is prevented.

Figure 16:
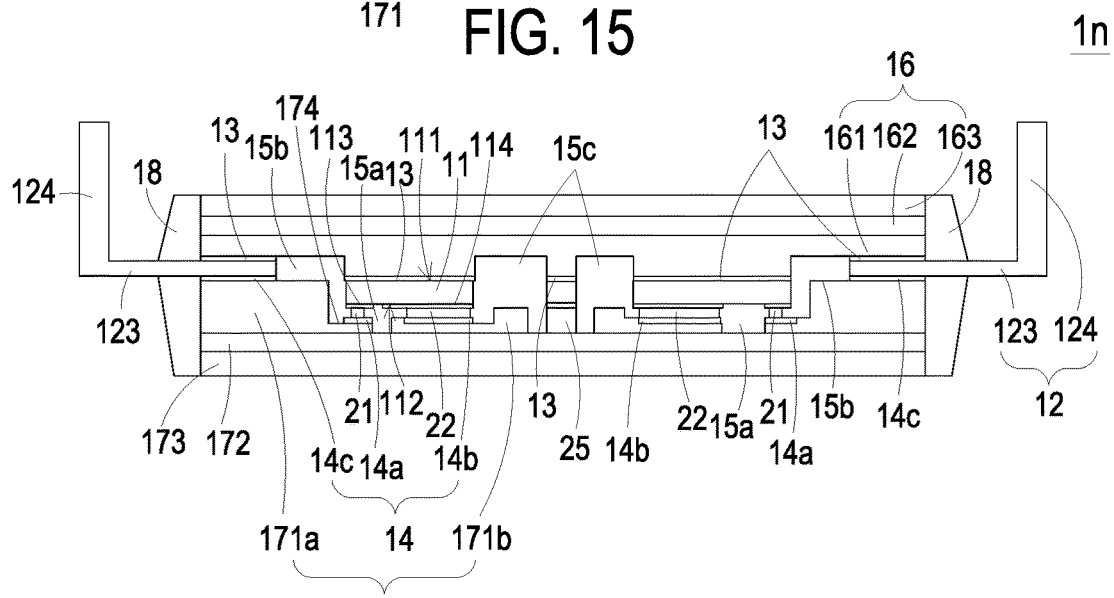
FIG. 16 is a schematic cross-sectional view illustrating a package structure according to a fifteenth embodiment of the present disclosure.

FIG. 16 is a schematic cross-sectional view illustrating a package structure according to a fifteenth embodiment of the present disclosure. Component parts and elements corresponding to those of the first embodiment are designated by identical numeral references, and detailed descriptions thereof are omitted. As shown in FIG. 16, comparing with the package structure 1m of FIG. 15, the package structure 1n includes a first conduction pillar 21 and a single second conduction pillar 22. The second conduction pillar 22 is connected between the plurality of second conductive terminals 114 of the semiconductor chip 11 and the second part 14b of the second conduction layer 14.

Figure 17A:
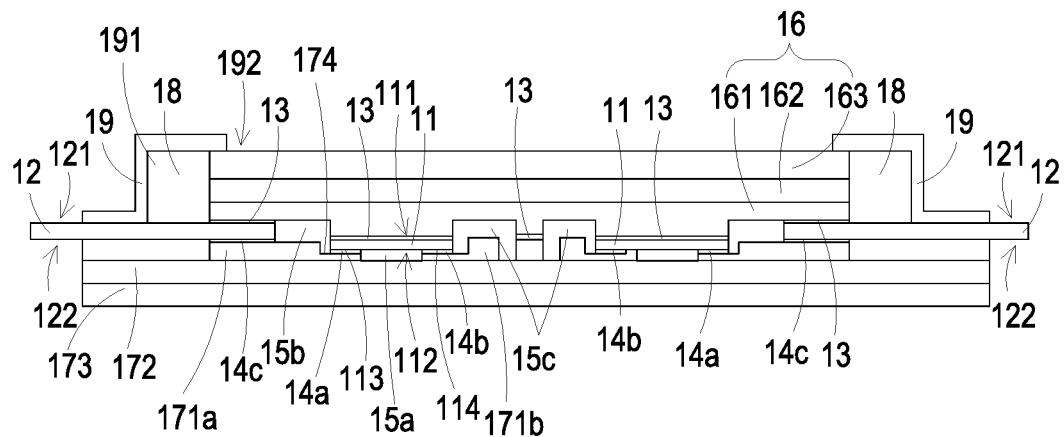
FIG. 17A is a schematic cross-sectional view illustrating a package structure according to a sixteenth embodiment of the present disclosure.
Figure 17B:
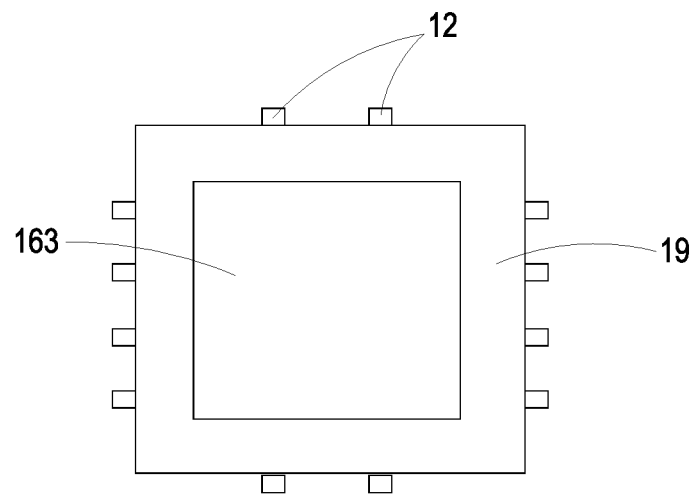
FIG. 17B is a schematic top view illustrating the package structure of FIG. 17A.

FIG. 17A is a schematic cross-sectional view illustrating a package structure according to a sixteenth embodiment of the present disclosure. FIG. 17B is a schematic top view illustrating a package structure of FIG. 17A. Component parts and elements corresponding to those of the first embodiment are designated by identical numeral references, and detailed descriptions thereof are omitted. As shown in FIGS. 17A and 17B, comparing with the package structure 1 of FIG. 1, the package structure 1o of this embodiment further includes a housing 19. The housing 19 has an accommodation space 191 and an opening 192. The opening 192 is in communication with the accommodation space 191. The housing 19 covers the second encapsulation member 16, the insulation structure 18 and portion of the metal pin 12 so that the second encapsulation member 16 and the insulation structure 18 are accommodated in the accommodation space 191 of the housing 19. Portion of the second encapsulation member 16 is exposed through the opening 192 for allowing the heat to be dissipated away along the second heat-dissipating channel. Consequently, the heat dissipation efficiency of the package structure 1o is enhanced and the package structure 1o can prevent form being impacted by using the housing 19.

Figure 18:
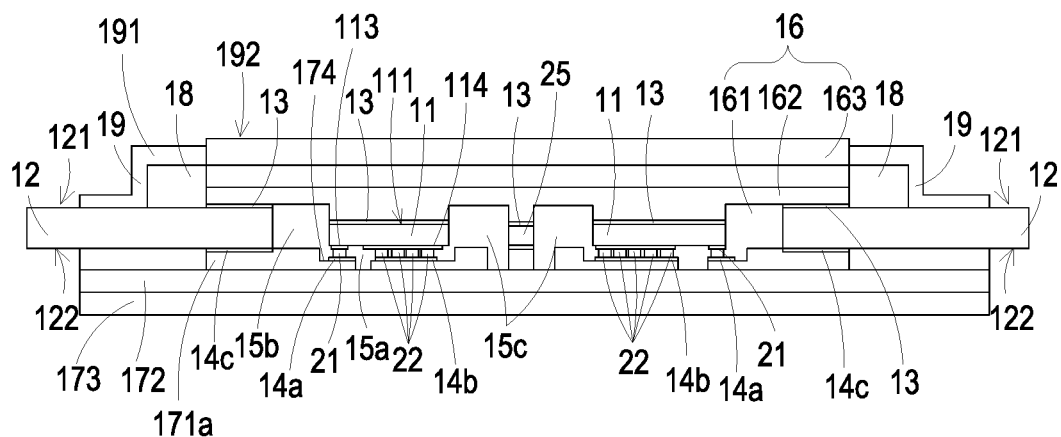
FIG. 18 is a schematic cross-sectional view illustrating a package structure according to a seventeenth embodiment of the present disclosure.

FIG. 18 is a schematic cross-sectional view illustrating a package structure according to a seventeenth embodiment of the present disclosure. Component parts and elements corresponding to those of the first embodiment are designated by identical numeral references, and detailed descriptions thereof are omitted. As shown in FIG. 18, comparing with the package structure 1o of FIG. 17A, the package structure 1p of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one first conductive pillar 21 is disposed in the first groove 174 and connected between the first conductive terminal 113 of the semiconductor chip 11 and the first part 14a of the second conduction layer 14. Each of the second conductive pillars 22 is disposed in the first groove 174 and connected between the corresponding second conductive terminal 114 of the semiconductor chip 11 and the second part 14b of the second conduction layer 14. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1p is better. In addition, at least one ultra-thin flip-chipped IC can be embedded in the package structure 1p so that the die attachment material shortage issue is prevented.

Figure 19:
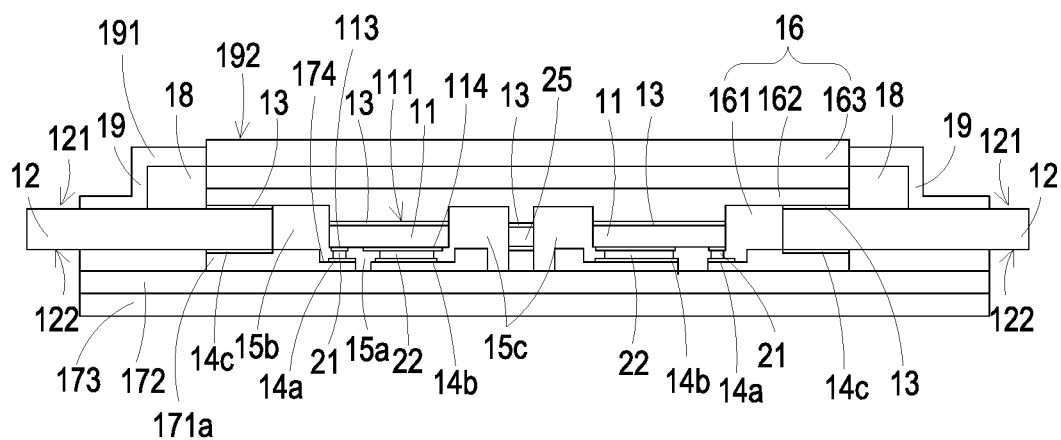
FIG. 19 is a schematic cross-sectional view illustrating a package structure according to an eighteenth embodiment of the present disclosure.

FIG. 19 is a schematic cross-sectional view illustrating a package structure according to an eighteenth embodiment of the present disclosure. Component parts and elements corresponding to those of the first embodiment are designated by identical numeral references, and detailed descriptions thereof are omitted. As shown in FIG. 19, comparing with the package structure 1p of FIG. 18, the package structure 1q further includes a first conduction pillar 21 and a single second conduction pillar 22. The second conduction pillar 22 is connected between the plurality of second conductive terminals 114 of the semiconductor chip 11 and the second part 14b of the second conduction layer 14.

FIG. 20 is a schematic cross-sectional view illustrating a package structure according to a nineteenth embodiment of the present disclosure. Component parts and elements corresponding to those of the first embodiment are designated by identical numeral references, and detailed descriptions thereof are omitted. As shown in FIG. 20, comparing with the package structure 1 of FIG. 1, the first metal layer 171 of the package structure 1r includes at least one second groove 175 and at least one third groove 177, and the at least one first groove 174 is omitted. Portion of the first insulation layer 172 is exposed through the at least one second groove 175 and the at least one third groove 177. The third metal layer 161 includes at least one fourth groove 166, and the first protrusion 164 is omitted. Portion of the third insulation layer 162 is exposed through the at least one fourth groove 166. The at least one third groove 177 is corresponding in position to the at least one fourth groove 166. The third part 15c of the second insulation layer 15 is disposed in the third groove 177 and the fourth groove 166. Namely, the third part 15c of the second insulation layer 15 is disposed among the first insulation layer 172, the third insulation layer 162, the first conduction layer 13, the semiconductor chip 11 and the second part 14b of the second conduction layer 14. In this embodiment, the first surface 111 of the semiconductor chip 11 is coplanar with the first surface 121 of the metal pin 12.

Figure 21A:
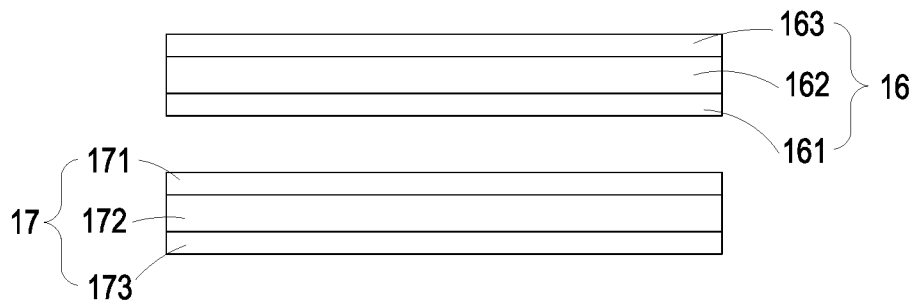
FIGS. 21A to 21E are schematic cross-sectional views illustrating a packaging process for the package structure of FIG. 20.

FIGS. 21A to 21E are schematic cross-sectional views illustrating a packaging process for the package structure of FIG. 20. Firstly, as shown in FIG. 21A, a first encapsulation member 17 and a second encapsulation member 16 are provided. In this embodiment, the first encapsulation member 17 includes a first metal layer 171, a first insulation layer 172 and a second metal layer 173, wherein the first metal layer 171 is formed on the first insulation layer 172, and the first insulation layer 172 is formed on the second metal layer 173. Therefore, the first insulation layer 172 is formed between the first metal layer 171 and the second metal layer 173. The second encapsulation member 16 includes a third metal layer 161, a third insulation layer 162 and a fourth metal layer 163, wherein the fourth metal layer 163 is formed on the third insulation layer 162, and the third insulation layer 162 is formed on the third metal layer 161.

Figure 21B:
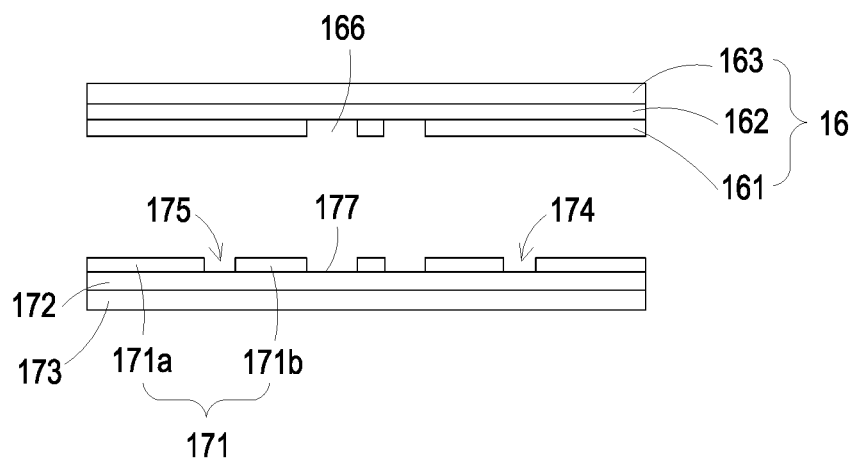

Then, as shown in FIG. 21B, the first encapsulation member 17 and the second encapsulation member 16 are performed with a patterning process, respectively. In this embodiment, the patterning process may include an etching process. In this embodiment, at least one second groove 175 and at least one third groove 177 are formed in the first metal layer 171 of the first encapsulation member 17, and at least one fourth groove 166 is formed in the third metal layer 161 of the second encapsulation member 16. The at least one fourth groove 166 is corresponding in position to the at least one third groove 177. Portion of the first insulation layer 172 is exposed through the second groove 175 and the third groove 177. Portion of the third insulation layer 162 is exposed through the fourth groove 166. The first metal layer 171 includes a first part 171a and a second part 171b. The first part 171a and the second part 171b are separated from each other by the second groove 175.

Figure 21C:
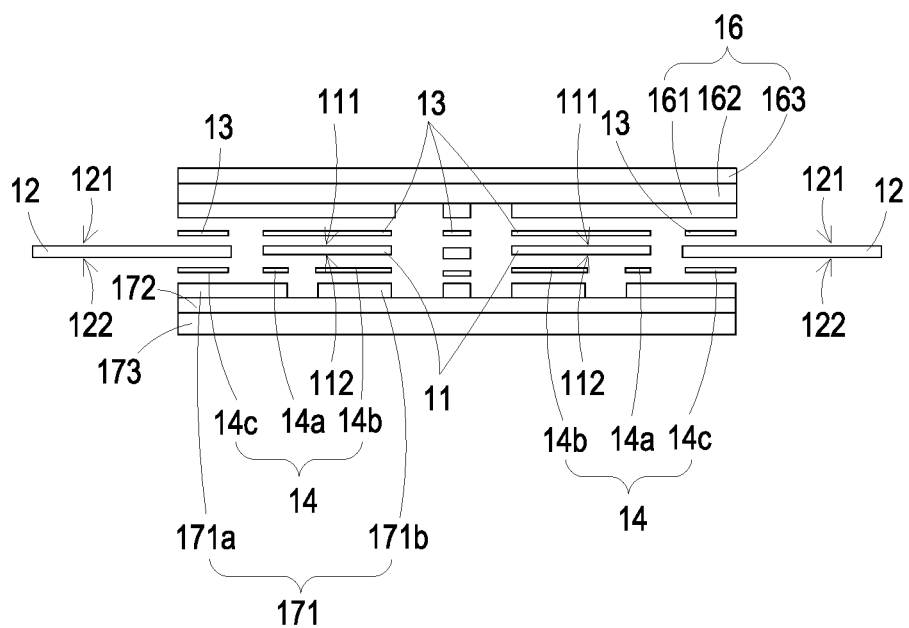

Then, as shown in FIG. 21C, at least one semiconductor chip 11, at least one metal pin 12, a first conduction layer 13 and a second conduction layer 14 are provided and disposed between the first encapsulation member 17 and the second encapsulation member 16. In this embodiment, a part of the first conduction layer 13 is disposed between the third metal layer 161 of the second encapsulation member 16 and the first surface 111 of the semiconductor chip 11, and the other part of the first conduction layer 13 is disposed between the third metal layer 161 of the second encapsulation member 16 and the first surface 121 of the metal pin 12. The second conduction layer 14 includes a first part 14a, a second part 14b and a third part 14c separated from each other. The first part 14a is disposed between the first part 171a of the first metal layer 171 and the at least one first conductive terminal 113 of the semiconductor chip 11. The second part 14b is disposed between the second part 171b of the first metal layer 171 and the at least one second conductive terminal 114 of the semiconductor chip 11. The third part 14c is disposed between the first part 171a of the first metal layer 171 and the second surface 122 of the metal pin 12. The semiconductor chip 11 is disposed between the first metal layer 171 and the third metal layer 161. In this embodiment, the first conduction layer 13 and the second conduction layer 14 are conductive pastes or conductive films, but not limited thereto.

Figure 21D:
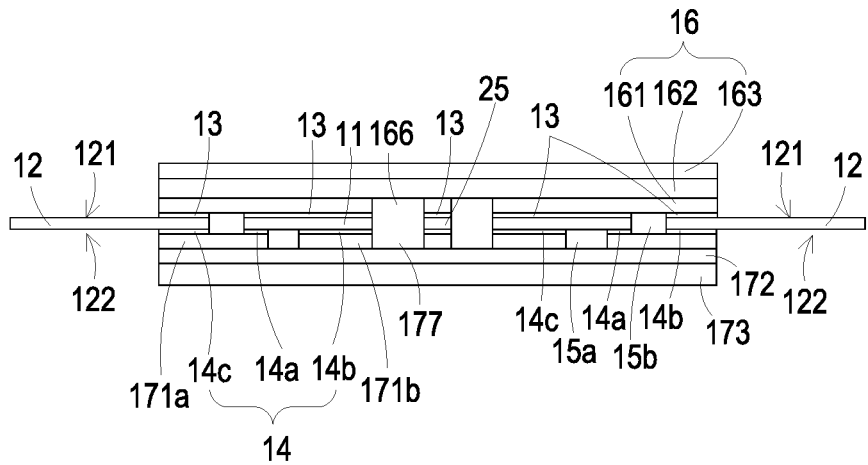

Then, as shown in FIG. 21D, a pressing process and a curing process are performed, so that the at least one semiconductor chip 11, the at least one metal pin 12, the first conduction layer 13, the second conduction layer 14, the first encapsulation member 17 and the second encapsulation member 16 are combined together. In this embodiment, the part of the first conduction layer 13 is connected between the third metal layer 161 of the second encapsulation member 16 and the first surface 111 of the semiconductor chip 11, and the other part of the first conduction layer 13 is connected between the third metal layer 161 of the second encapsulation member 16 and the first surface 121 of the metal pin 12. The first part 14a is connected between the first part 171a of the first metal layer 171 and the at least one first conductive terminal 113 of the semiconductor chip 11. The second part 14b is connected between the second part 171b of the first metal layer 171 and the at least one second conductive terminal 114 of the semiconductor chip 11. The third part 14c is connected between the first part 17a of the first metal layer 171 and the second surface 122 of the metal pin 12. The first surface 111 of the semiconductor chip 11 is coplanar with the first surface 121 of the metal pin 12.

Figure 21E:
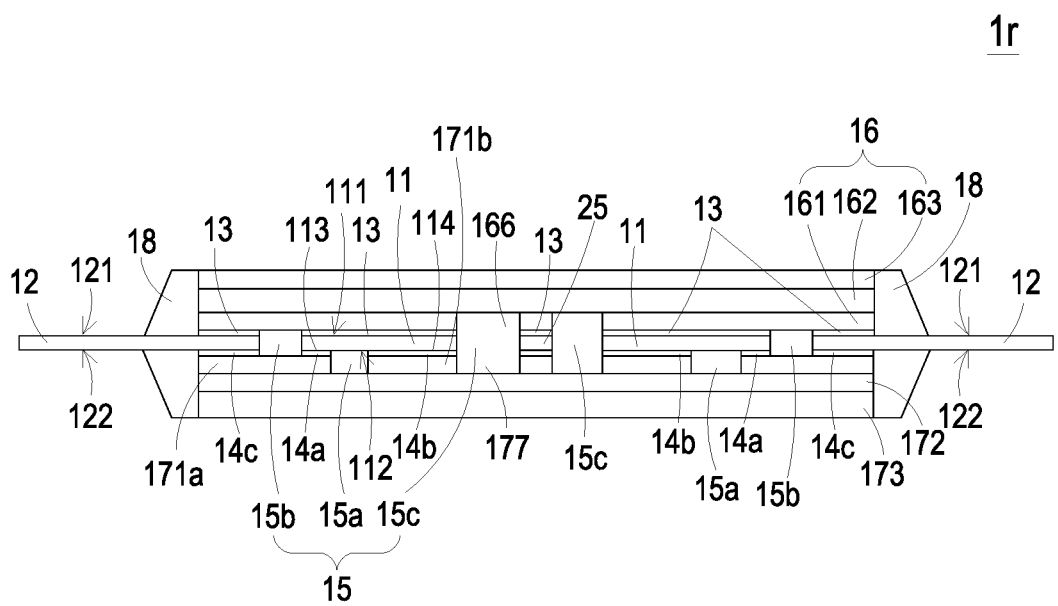

Then, as shown in FIG. 21E, a filling process is performed so that a second insulation layer 15 is disposed between the first encapsulation member 16 and the second encapsulation member 17. Then, at least one insulation structure 18 is formed on the lateral sides of the first encapsulation member 17 and the second encapsulation member 16 and surrounds portion of the metal pin 12 for allowing portion of the metal pin 12 to be exposed. Consequently, the package structure 1r is formed. In this embodiment, the second insulation layer 15 includes a first part 15a, a second part 15b and a third part 15c. The first part 15a is disposed among the first part 171a of the first metal layer 171, the second part 171b of the first metal layer 171, portion of the first insulation layer 172, the first part 14a of the second conduction layer 14, the second part 14b of the second conduction layer 14 and portion of the second surface 112 of the semiconductor chip 11. The second part 15b is disposed among the semiconductor chip 11, the metal pin 12, the first conduction layer 13, the third metal layer 161 of the second encapsulation member 16, the second part 171a of the first metal layer 171, the first part 14a of the second conduction layer 14 and the third part 14c of the second conduction layer 14. The third part 15c is disposed in the third groove 177 and the fourth groove 166. The third part 15c is disposed among the semiconductor chip 11, the third metal layer 161 of the second encapsulation member 16, the third insulation layer 162 of the second encapsulation member 16, the first insulation layer 172, the second part 171b of the first metal layer 171, the second part 14b of the second conduction layer 14 and the first conduction layer 13. In this embodiment, a part of the metal pin 12 is disposed between the first conduction layer 13 and the third part 14c of the second conduction layer 14, another part of the metal pin 12 is embedded in the insulation structure 18, and the other part of the metal pin 12 is exposed. The metal pin 12 is connected to the at least one first conductive terminal 113 of the semiconductor chip 11 through the third part 14c of the second conduction layer 14, the first part 171a of the first metal layer 171 and the first part 14a of the second conduction layer 14, so that the metal pin 12 can be served as a pin-out of the package structure 1r. Consequently, the package structure 1r is formed.

Figure 22:
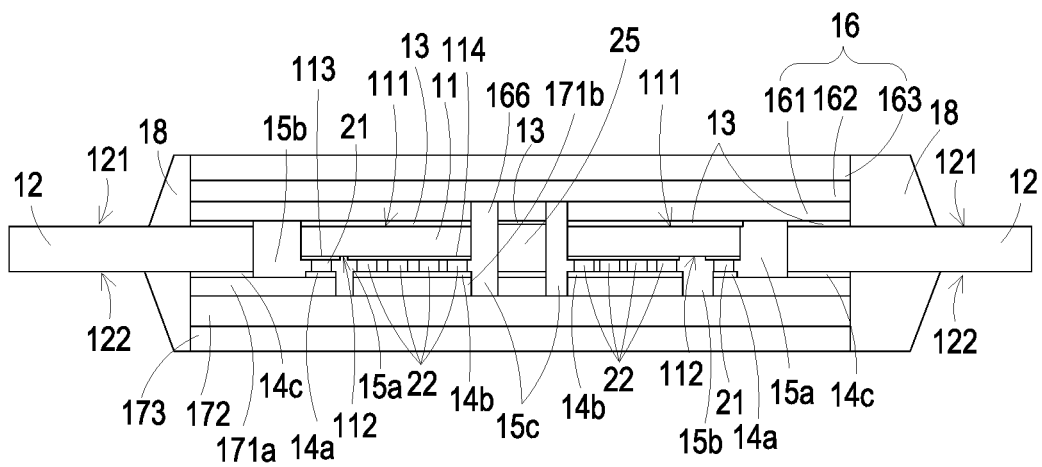
FIG. 22 is a schematic cross-sectional view illustrating a package structure according to a twentieth embodiment of the present disclosure.

FIG. 22 is a schematic cross-sectional view illustrating a package structure according to a twentieth embodiment of the present disclosure. Component parts and elements corresponding to those of the first embodiment are designated by identical numeral references, and detailed descriptions thereof are omitted. As shown in FIG. 22, comparing with the package structure 1r of FIG. 20, the package structure 1s of this embodiment further includes at least one first conductive pillar 21 and a plurality of second conductive pillars 22. The semiconductor chip 11 has at least one first conductive terminal 113 and a plurality of second conductive terminals 114. The first conductive pillar 21 is connected with the first conductive terminal 113 of the semiconductor chip 11, and the plurality of second conductive pillars 22 are connected with the plurality of the second conductive terminals 114 of the semiconductor chip 11. In this embodiment, the at least one conductive terminal 21 is connected between the first conductive terminal 113 of the semiconductor chip 11 and the first part 14a of the second conduction layer 14. Each of the second conductive pillars 22 is connected between the corresponding second conductive terminal 114 of the semiconductor chip 11 and the second part 14b of the second conduction layer 14. The first surface 111 of the semiconductor chip 11 is coplanar with the first surface 121 of the metal pin 12. The first part 15a of the second insulation layer 15 is disposed among the semiconductor chip 11, the first conductive pillar 21, the first part 14a of the second conduction layer 14, the first part 171a of the first metal layer 171, a part of the first insulation layer 172, the second part 171b of the first metal layer 171, the second part 14b of the second conduction layer 14 and the second conductive pillars 22. In an embodiment, the first conductive pillar 21 is copper pillar, and the second conductive pillar 22 is copper pillar. Since the first conductive terminal 113 of the semiconductor chip 11 is connected with the first part 14a of the second conduction layer 14 via the first conductive pillar 21 and the second conductive terminals 114 of the semiconductor chip 11 are connected with the second part 14b of the second conduction layer 14 via the plurality of second conductive pillars 22, the semiconductor chip 11 is not directly connected with the second conduction layer 14 so that the line space ratio of conductive trace of the package structure 1s is better. In addition, at least one ultra-thin flip-chipped IC can be embedded in the package structure is so that the die attachment material shortage issue is prevented.

Figure 23:
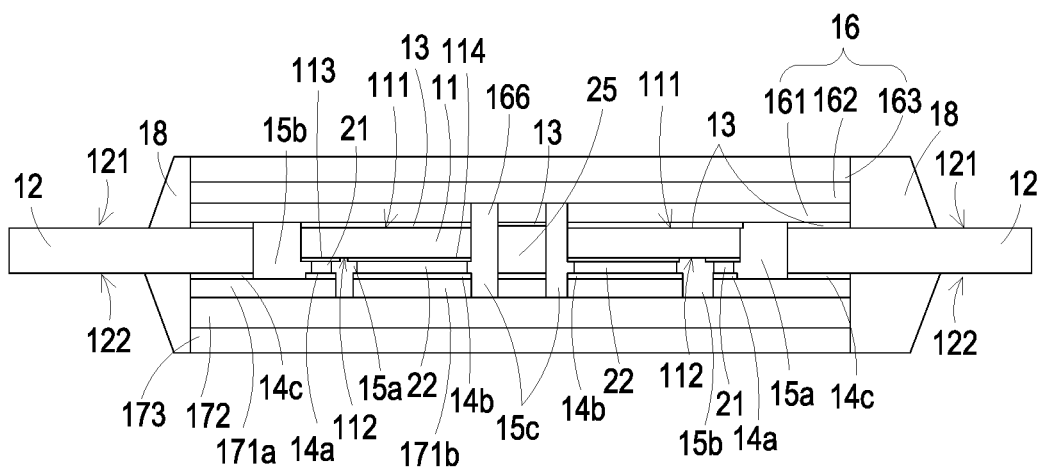
FIG. 23 is a schematic cross-sectional view illustrating a package structure according to a twenty-first embodiment of the present disclosure.

FIG. 23 is a schematic cross-sectional view illustrating a package structure according to a twenty-first embodiment of the present disclosure. Component parts and elements corresponding to those of the first embodiment are designated by identical numeral references, and detailed descriptions thereof are omitted. As shown in FIG. 23, comparing with the package structure is of FIG. 22, the package structure 1t includes a first conduction pillar 21 and a single second conduction pillar 22. The second conduction pillar 22 is connected between the plurality of second conductive terminals 114 of the semiconductor chip 11 and the second part 14b of the second conduction layer 14.

Figure 24:
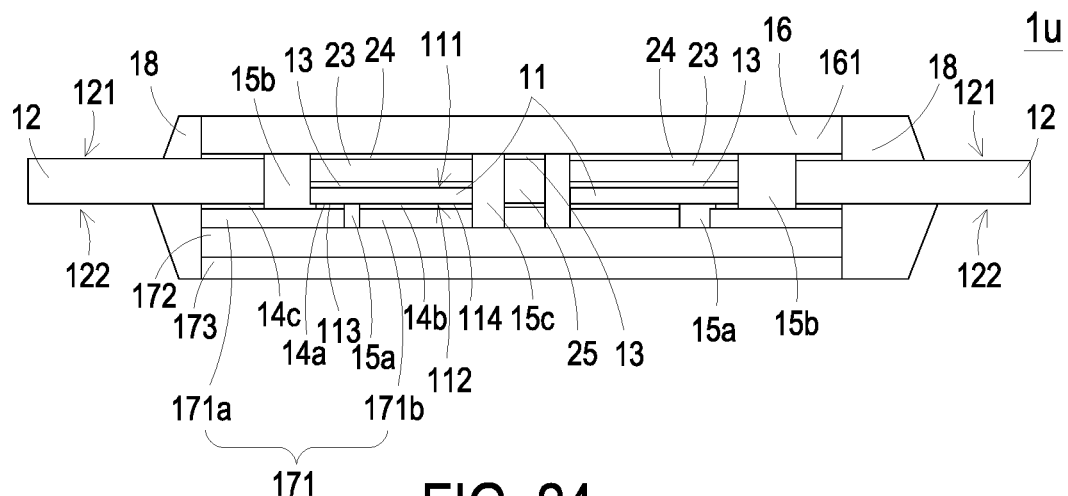
FIG. 24 is a schematic cross-sectional view illustrating a package structure according to a twenty-second embodiment of the present disclosure.

FIG. 24 is a schematic cross-sectional view illustrating a package structure according to a twenty-second embodiment of the present disclosure. As shown in FIG. 24, comparing with the package structure 1r of FIG. 20, the package structure 1u of this embodiment further includes a conduction spacer 23 and a third conduction layer 24, the second encapsulation member 16 only includes the third metal layer 161, and the third insulation layer 162 and the fourth metal layer 163 are omitted. One side of the third metal layer 161 is attached to the third conduction layer 24 and the second insulation layer 15. The other side of the third metal layer 161 is exposed. Since the second encapsulation member 16 of the package structure 1u only includes the third metal layer 161, the heat dissipating efficiency of the package structure 1u is better. The conduction spacer 23 is disposed between the semiconductor chip 11 and the third metal layer 161 of the second encapsulation member 16. The first conduction layer 13 is connected between the semiconductor chip 11 and the conduction spacer 23. The third conduction layer 24 is connected between the conduction spacer 23 and the third metal layer 161.

Figure 25:
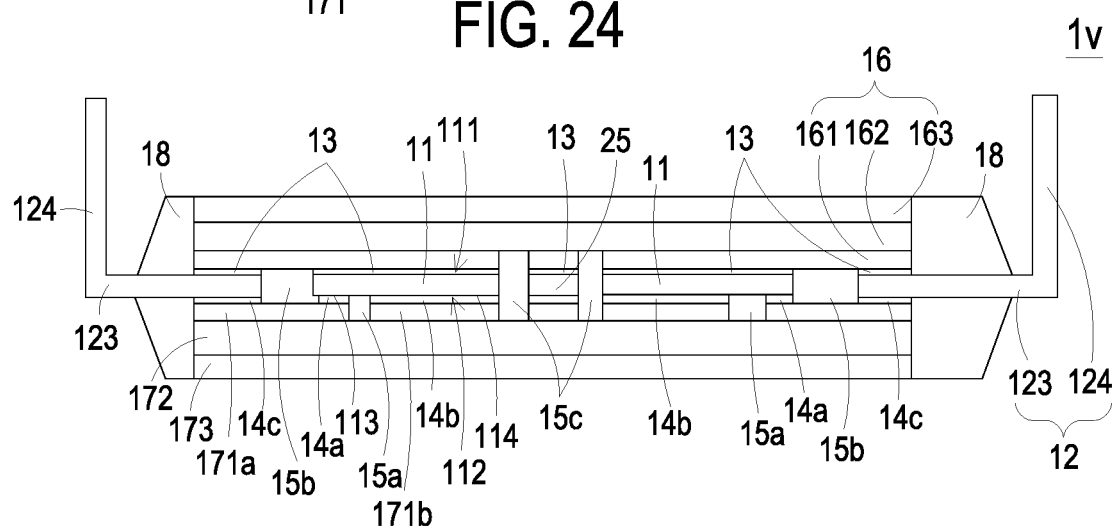
FIG. 25 is a schematic cross-sectional view illustrating a package structure according to a twenty-third embodiment of the present disclosure.

FIG. 25 is a schematic cross-sectional view illustrating a package structure according to a twenty-third embodiment of the present disclosure. Component parts and elements corresponding to those of the first embodiment are designated by identical numeral references, and detailed descriptions thereof are omitted. As shown in FIG. 25, comparing with the package structure 1r of FIG. 20, the metal pin 12 of the package structure 1v includes a first part 123 and a second part 124. A portion of the first part 123 is disposed between the first conduction layer 13 and the third part 14c of the second conduction layer 14, another portion of the first part 123 is embedded within the insulation structure 18, and the other portion of the first part 123 is exposed. The second part 124 is vertically connected with one end of the first part 123 and extended outwardly. The first part 123 and the second part 124 are formed into L-shaped. In this embodiment, the second part 124 of the metal pin 12 can be inserted into a corresponding via hole of a circuit board (not shown).

Figure 26:
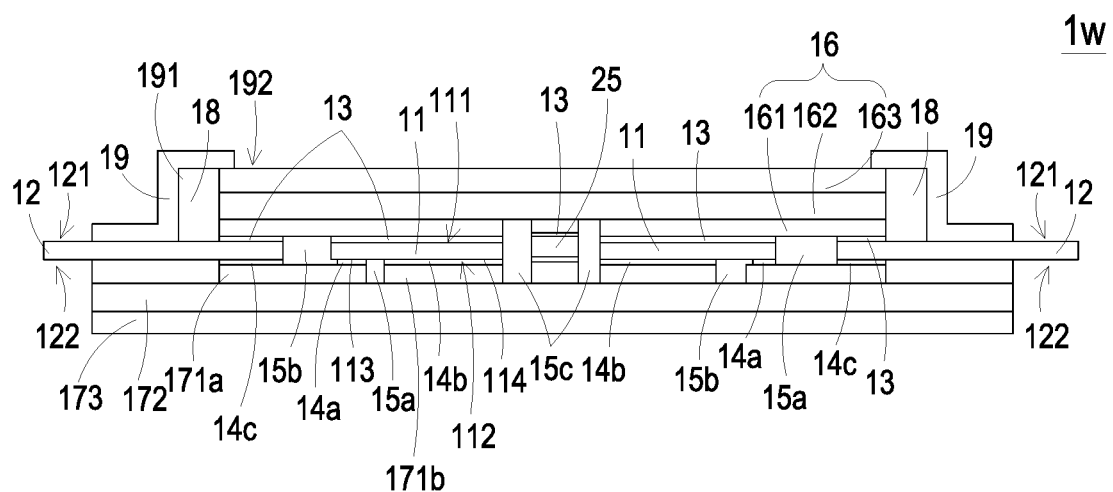
FIG. 26 is a schematic cross-sectional view illustrating a package structure according to a twenty-fourth embodiment of the present disclosure.

FIG. 26 is a schematic cross-sectional view illustrating a package structure according to a twenty-fourth embodiment of the present disclosure. Component parts and elements corresponding to those of the first embodiment are designated by identical numeral references, and detailed descriptions thereof are omitted. As shown in FIG. 26, comparing with the package structure 1r of FIG. 20, the package structure 1w of this embodiment further includes a housing 19. The housing 19 has an accommodation space 191 and an opening 192. The opening 192 is in communication with the accommodation space 191. The housing 19 covers the second encapsulation member 16, the insulation structure 18 and portion of the metal pin 12 so that the second encapsulation member 16 and the insulation structure 18 are accommodated in the accommodation space 191 of the housing 19. Portion of the second encapsulation member 16 is exposed through the opening 192 for allowing the heat to be dissipated away along the second heat-dissipating channel. Consequently, the heat dissipation efficiency of the package structure 1w is enhanced and the package structure 1w can prevent form being impacted by using the housing 19.

From the above description, the embodiments of the present disclosure provide a package structure. At least one semiconductor chip is disposed between a first encapsulation member and a second encapsulation member and a dual sides cooling mechanism is employed to dissipate the heat to the surroundings. Consequently, the heat dissipating efficiency is enhanced, and the package structure is simplified and applicable to a flip-chipped semiconductor chip. Moreover, the first conductive terminal of the semiconductor chip is connected with the first part of the second conduction layer via the first conduction pillar, and the second conductive terminals of the semiconductor chip is connected with the second part of the second conduction layer via at least one second pillar. Since the conductive terminals of the semiconductor chip are not directly connected with the second conduction layer, the line space ratio of conductive trace of the package structure is better. In addition, at least one ultra-thin flip-chipped IC can be embedded in the package structure so that the die attachment material shortage issue is prevented.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure comprising:
    a first encapsulation member comprising a first metal layer, a first insulation layer and a second metal layer, the first metal layer comprising at least one first groove, the first insulation layer being formed between the first metal layer and the second metal layer;
    a second encapsulation member comprising a third metal layer, the third metal layer comprising at least one first protrusion disposed at a position corresponding to the at least one first groove;
    at least one semiconductor chip disposed between the first encapsulation member and the second encapsulation member and accommodated in the at least one first groove, the at least one semiconductor chip comprising a plurality of conductive terminals connected with the first metal layer or the third metal layer;
    a plurality of metal pins disposed between the second encapsulation member and the first encapsulation member and extended outward from the first encapsulation member and the second encapsulation member, the plurality of metal pins being electrically connected with the plurality of conductive terminals respectively; and
    a second insulation layer contacted with the plurality of metal pins and disposed between the first encapsulation member and the second encapsulation member for securing the first encapsulation member, the second encapsulation member, the at least one semiconductor chip, and the plurality of metal pins.

2. The package structure according to claim 1, wherein the first metal layer is formed on the first insulation layer and comprises a first part and a second part separated from each other, wherein the at least one semiconductor chip comprises a first surface, a second surface opposite to the first surface, at least one first conductive terminal of the plurality of conductive terminals and at least one second conductive terminal of the plurality of conductive terminals, wherein the at least one first conductive terminal and the at least one second conductive terminal are disposed on the second surface, the at least one first conductive terminal is connected with the first part of the first metal layer, and the at least one second conductive terminal is connected with the second part of the first metal layer, wherein the second insulation layer comprises a first part, a second part and a third part, wherein the first part of the second insulation layer is disposed among the at least one semiconductor chip, the first part of the first metal layer, the second part of the first metal layer and the first insulation layer, the second part of the second insulation layer is disposed among the at least one semiconductor chip, a metal pin of the plurality of metal pins, the first part of the first metal layer and the third metal layer, and the third part of the second insulation layer is disposed among the at least one semiconductor chip, the second part of the first metal layer and the third metal layer.

3. The package structure according to claim 2, further comprising a first conduction layer disposed between the first encapsulation member and the second encapsulation member, wherein a part of the first conduction layer is connected between the first surface of the at least one semiconductor chip and the third metal layer, and another part of the first conduction layer is connected between a first surface of the metal pin of the plurality of metal pins and the third metal layer.

4. The package structure according to claim 2, further comprising a second conduction layer disposed between the first encapsulation member and the second encapsulation member and comprising a first part, a second part and a third part, wherein the first part of the second conduction layer is connected between the at least one first conductive terminal and the first part of the first metal layer, the second part of the second conduction layer is connected between the at least one second conductive terminal and the second part of the first metal layer, and the third part is connected between a second surface of the metal pin of the plurality of metal pins and the first metal layer.

5. The package structure according to claim 2, wherein the first metal layer comprises at least one second groove, the at least one first groove and the at least one second groove are located between the first part of the first metal layer and the second part of the first metal layer, wherein the second groove is disposed in the first groove, a portion of the second insulation layer is exposed through the first groove and the second groove, wherein the at least one semiconductor chip is accommodated in the first groove.

6. The package structure according to claim 5, wherein the second encapsulation member further comprises:
    a third insulation layer formed on the third metal layer; and
    a fourth metal layer formed on the third insulation layer.

7. The package structure according to claim 6, wherein the first metal layer comprises at least one second groove and at least one third groove, and the third metal layer comprises at least one fourth groove, wherein portion of the first insulation layer is exposed through the third groove, portion of the third insulation layer is exposed through the fourth groove, and the at least one third groove is corresponding in position to the at least one fourth groove, wherein the third part of the second insulation layer is disposed in the third groove and the fourth groove and is disposed among the second part of the first metal layer, the first insulation layer, the semiconductor chip, the third metal layer and the third insulation layer.

8. The package structure according to claim 4, wherein the at least one second conductive terminal of the semiconductor chip comprises a plurality of second conductive terminals, wherein the package structure further comprises:
    at least one first conductive pillar connected with the at least one first conductive terminal of the semiconductor chip and the first part of the second conduction layer; and
    a plurality of second conductive pillars connected between the plurality of the second conductive terminals of the semiconductor chip and the second part of the second conduction layer.

9. The package structure according to claim 4, wherein the at least one second conductive terminal of the semiconductor chip comprises a plurality of second conductive terminals, wherein the package structure further comprises:
    a first conductive pillar connected with the first conductive terminal of the semiconductor chip and the first part of the second conduction layer; and
    a second conductive pillar connected between the plurality of the second conductive terminals of the semiconductor chip and the second part of the second conduction layer.

10. The package structure according to claim 2, wherein the first surface of the semiconductor chip is coplanar with one surface of the metal pin.

11. The package structure according to claim 2, further comprising a first conduction layer connected between the first surface of the at least one semiconductor chip and the third metal layer, wherein the second part of the second insulation layer is disposed among the first part of the first metal layer, the metal pin, the third metal layer and the at least one semiconductor chip.

12. The package structure according to claim 2, wherein the metal pin includes a first part and a second part, wherein the first part of the metal pin is partially disposed between the first part of the first conduction layer and the third metal layer, and the second part of the metal pin is vertically connected with one end of the first part of the metal pin.

13. The package structure according to claim 1, further comprising an insulation structure disposed on lateral sides of the first encapsulation member and the second encapsulation member, wherein the metal pin is partially embedded in the insulation structure.

14. The package structure according to claim 1, wherein the first metal layer comprises at least one recess, wherein a part of the metal pin is disposed in the recess.

15. The package structure according to claim 1, further comprising a spacer disposed between the first metal layer and the third metal layer for electrically connecting the first metal layer and the third metal layer.

16. The package structure according to claim 15, wherein the top surface of the spacer is coplanar with a first surface of the semiconductor chip.

17. The package structure according to claim 1, further comprising a housing covering the second encapsulation member and comprising an accommodation space and an opening in communication with the accommodation space, wherein the second encapsulation member is accommodated in the accommodation space, and portion of the second encapsulation member is exposed through the opening.

18. The package structure according to claim 1, further comprising at least one heat dissipation device disposed on one surface of the first encapsulation member or one surface of the second encapsulation member.

19. The package structure according to claim 1, wherein the at least one semiconductor chip is a flip-chipped integrated circuit chip.

* * * * *